United States Patent
Barry

(10) Patent No.: US 11,618,951 B2
(45) Date of Patent: Apr. 4, 2023

(54) CHEMICAL EVAPORATION CONTROL SYSTEM

(71) Applicant: Global Circuit Innovations Inc., Colorado Springs, CO (US)

(72) Inventor: Timothy Mark Barry, Colorado Springs, CO (US)

(73) Assignee: Global Circuit Innovations Incorporated, Colorado Springs, CO (US)

( * ) Notice: Subject to any disclaimer, the term of this patent is extended or adjusted under 35 U.S.C. 154(b) by 131 days.

(21) Appl. No.: 16/884,829

(22) Filed: May 27, 2020

(65) Prior Publication Data

US 2021/0371984 A1 Dec. 2, 2021

(51) Int. Cl.
| | |
|---|---|
| C23C 18/16 | (2006.01) |
| H01L 21/67 | (2006.01) |
| B05C 11/11 | (2006.01) |
| B05C 11/115 | (2006.01) |
| B05C 3/02 | (2006.01) |
| C23C 18/42 | (2006.01) |
| C23C 18/32 | (2006.01) |

(52) U.S. Cl.
CPC ............ C23C 18/1628 (2013.01); B05C 3/02 (2013.01); B05C 11/11 (2013.01); B05C 11/115 (2013.01); C23C 18/1633 (2013.01); C23C 18/32 (2013.01); C23C 18/42 (2013.01); H01L 21/6715 (2013.01)

(58) Field of Classification Search
CPC ...... B01L 2300/045; B01L 3/52; B01L 3/523; B01L 3/527; B01L 3/00; B01L 3/50; G01N 27/74; C23C 18/1628; C23C 18/32; C23C 18/42; C23C 18/54; C23C 18/1633; H01L 21/6715; G06F 1/16; B65D 2313/04; B05C 3/02; B05C 11/11; F16K 31/086
USPC .......... 422/301, 302; 436/149–150; 206/818; 220/230; 204/193, 400
See application file for complete search history.

(56) References Cited

U.S. PATENT DOCUMENTS

| | | |
|---|---|---|
| 1,526,644 A | 10/1922 | Pinney |
| 3,664,933 A | 5/1972 | Clauss |
| 3,706,635 A | 12/1972 | Kowalski |
| 3,716,462 A | 2/1973 | Jensen |
| 3,878,066 A | 4/1975 | Dettke et al. |
| 6,660,137 B2 | 12/2003 | Wilson et al. |
| 6,916,412 B2 | 7/2005 | Woodruff et al. |
| 7,585,398 B2 | 9/2009 | Hanson et al. |
| 2014/0034080 A1* | 2/2014 | Paquet ............... A45C 13/1069 132/286 |

(Continued)

Primary Examiner — Laura Edwards
(74) Attorney, Agent, or Firm — Thomas J. Lavan

(57) ABSTRACT

An apparatus is provided. The apparatus may include one or more of a container, a first magnet assembly, and a second magnet assembly. The container includes an open top and is configured to hold a liquid chemical solution. The first magnet assembly includes a first magnet having a first polarity and a cover, coupled to the first magnet. The cover is configured to be movable between an open and a closed position and limit evaporation of the solution when the cover is in the closed position. The second magnet assembly includes a second magnet having a second polarity. In response to a command, the second magnet assembly is configured to move the cover to the open position without direct contact to the first magnet assembly in response to a command.

20 Claims, 31 Drawing Sheets

(56) References Cited

U.S. PATENT DOCUMENTS

| | | | |
|---|---|---|---|
| 2015/0024377 A1* | 1/2015 | Edwards | G01N 33/56911 435/5 |
| 2015/0217294 A1* | 8/2015 | Tamura | C12M 37/00 435/307.1 |
| 2017/0298966 A1* | 10/2017 | Nath | F04C 29/124 |

* cited by examiner

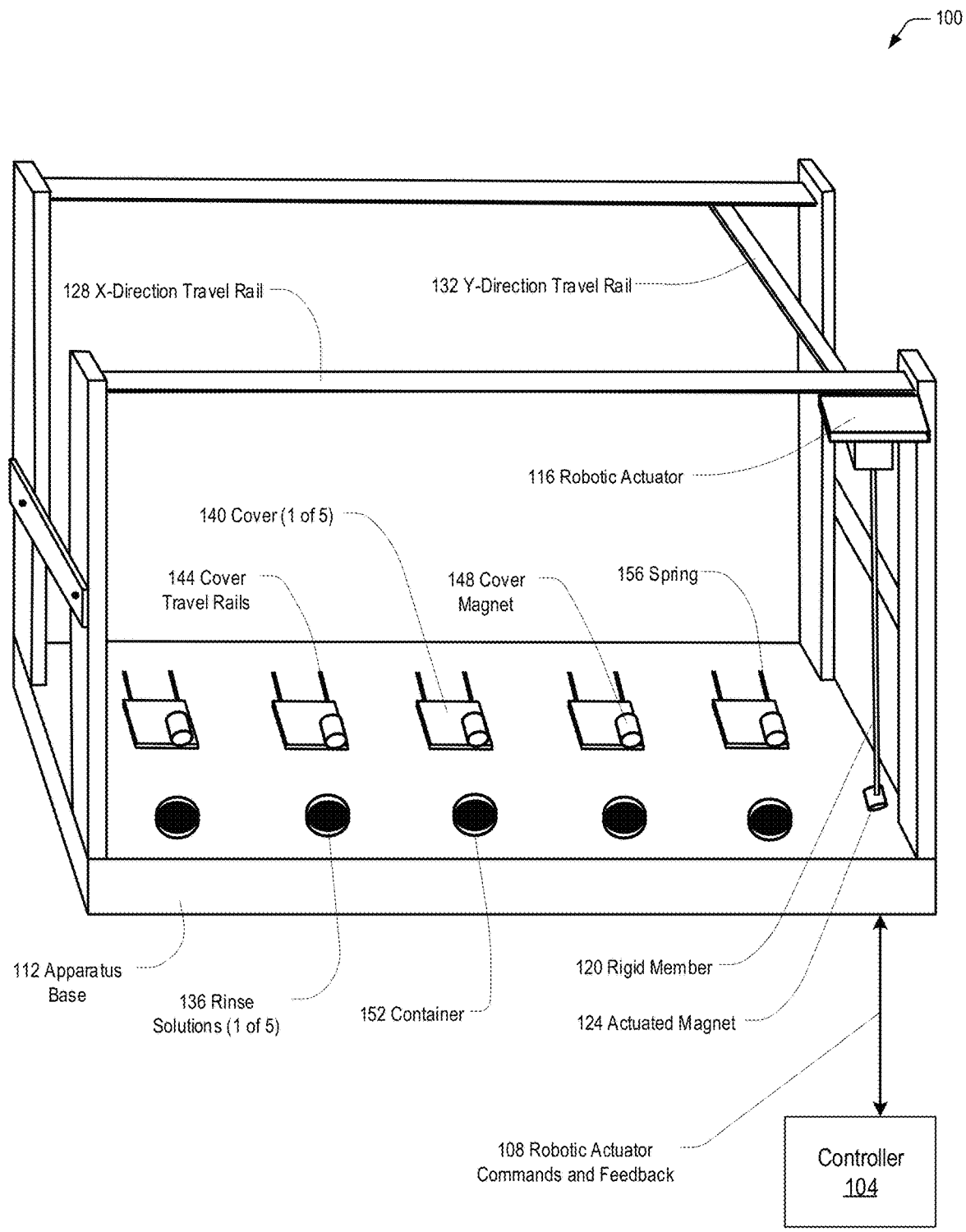
Fig. 1A Automated Plating Apparatus

*Fig. 1B Automated Plating Apparatus*
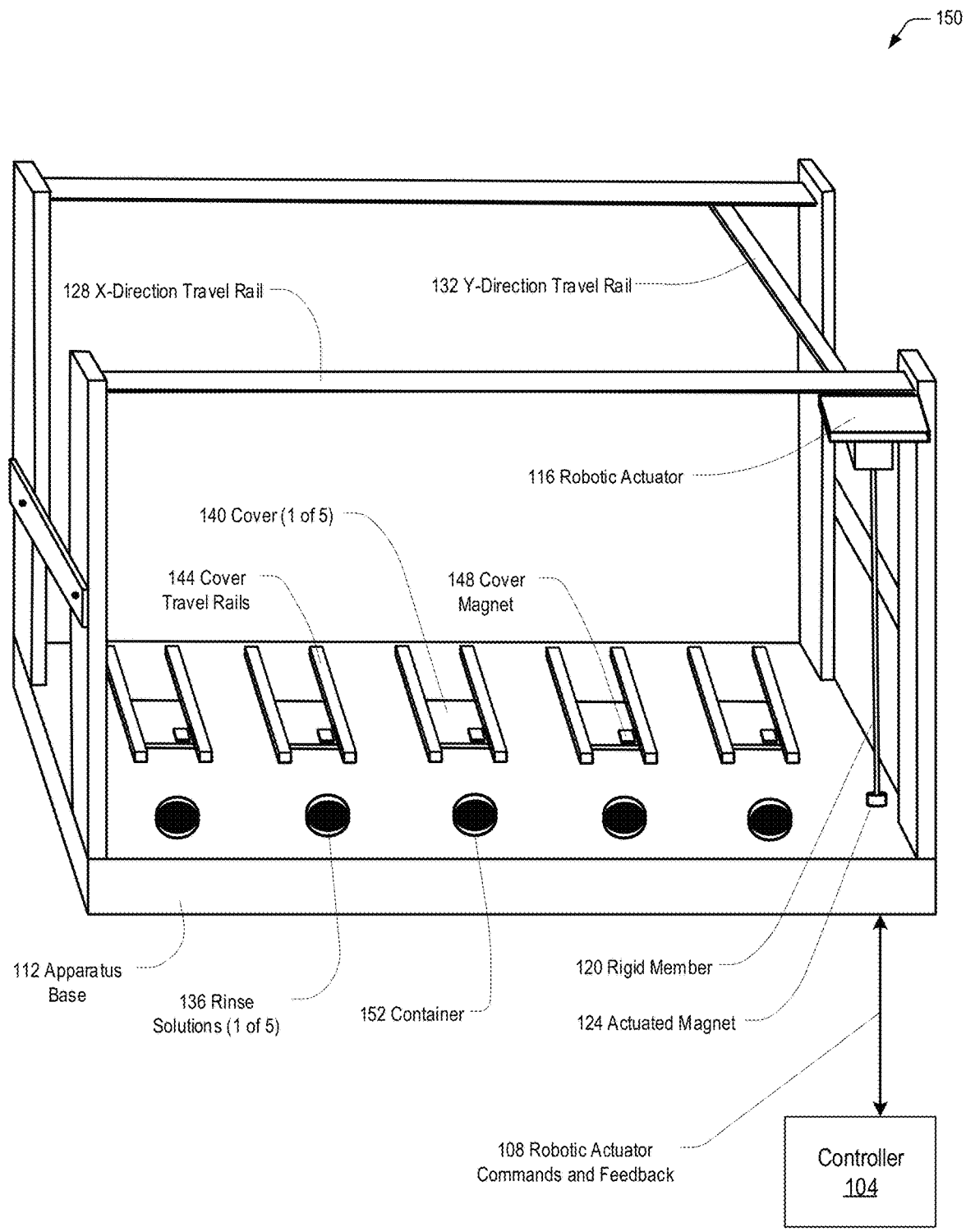

Fig. 2A  X-Direction Movement
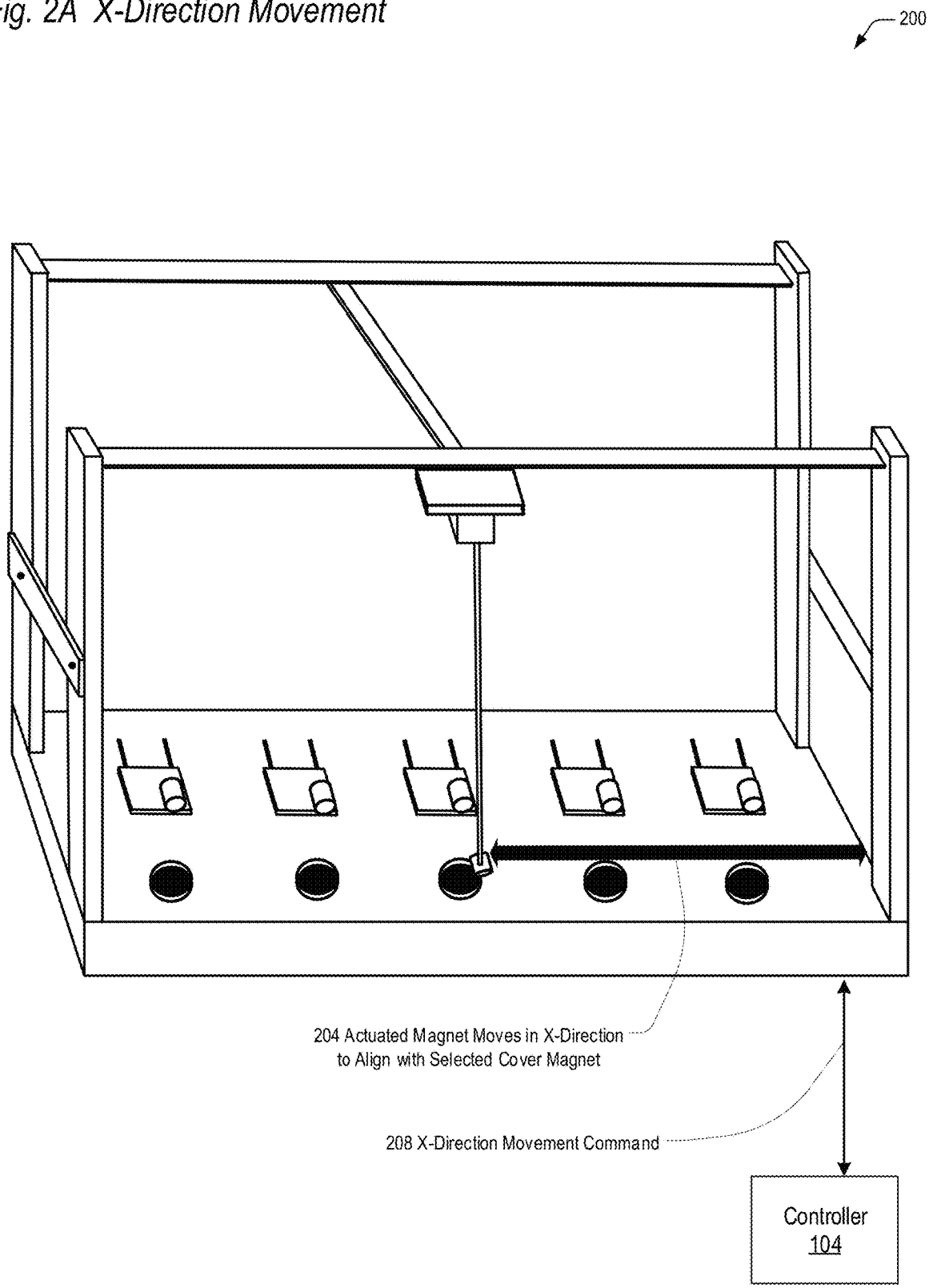

Fig. 2B X-Direction Movement
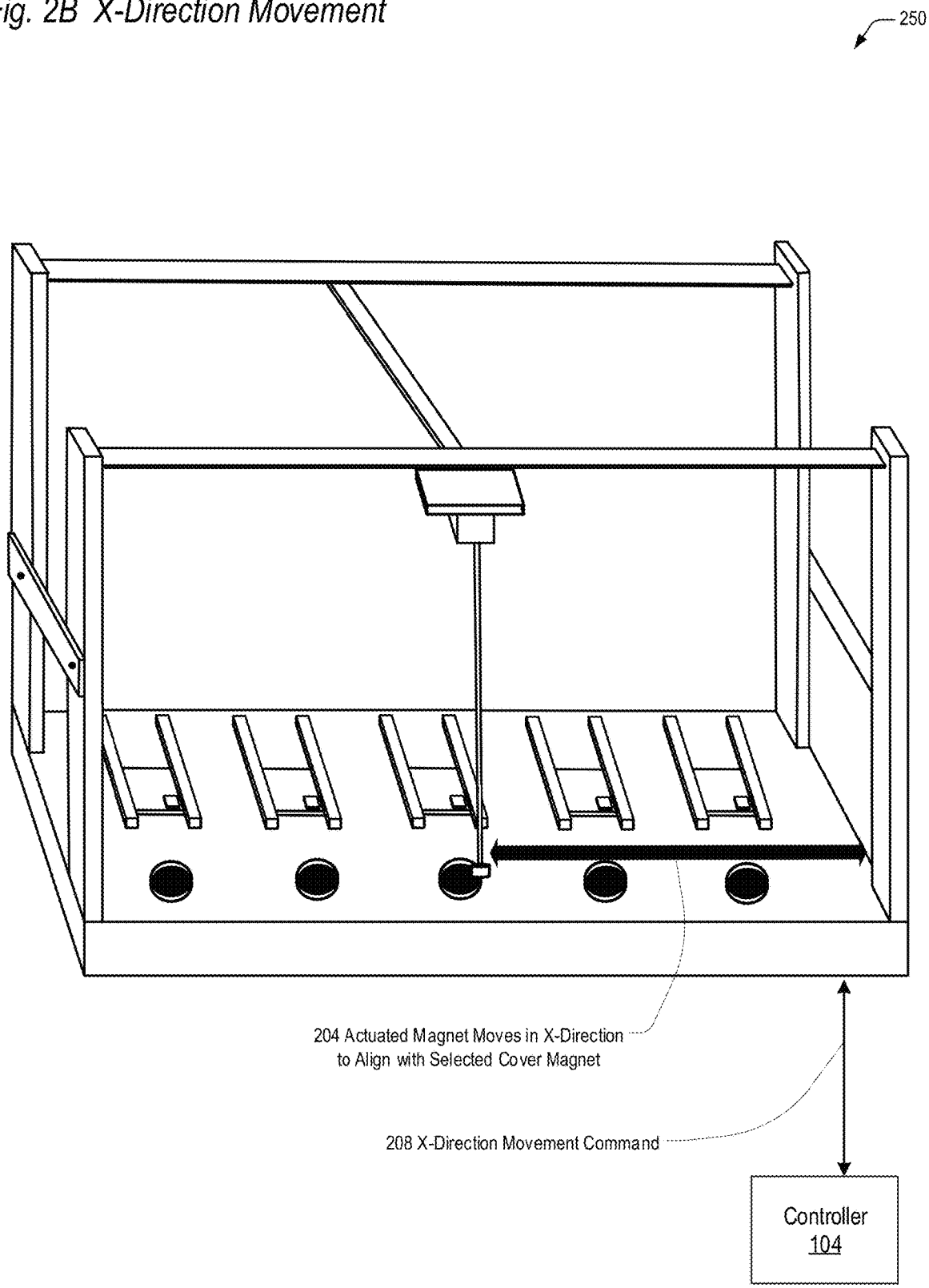

Fig. 3A  Y-Direction Movement
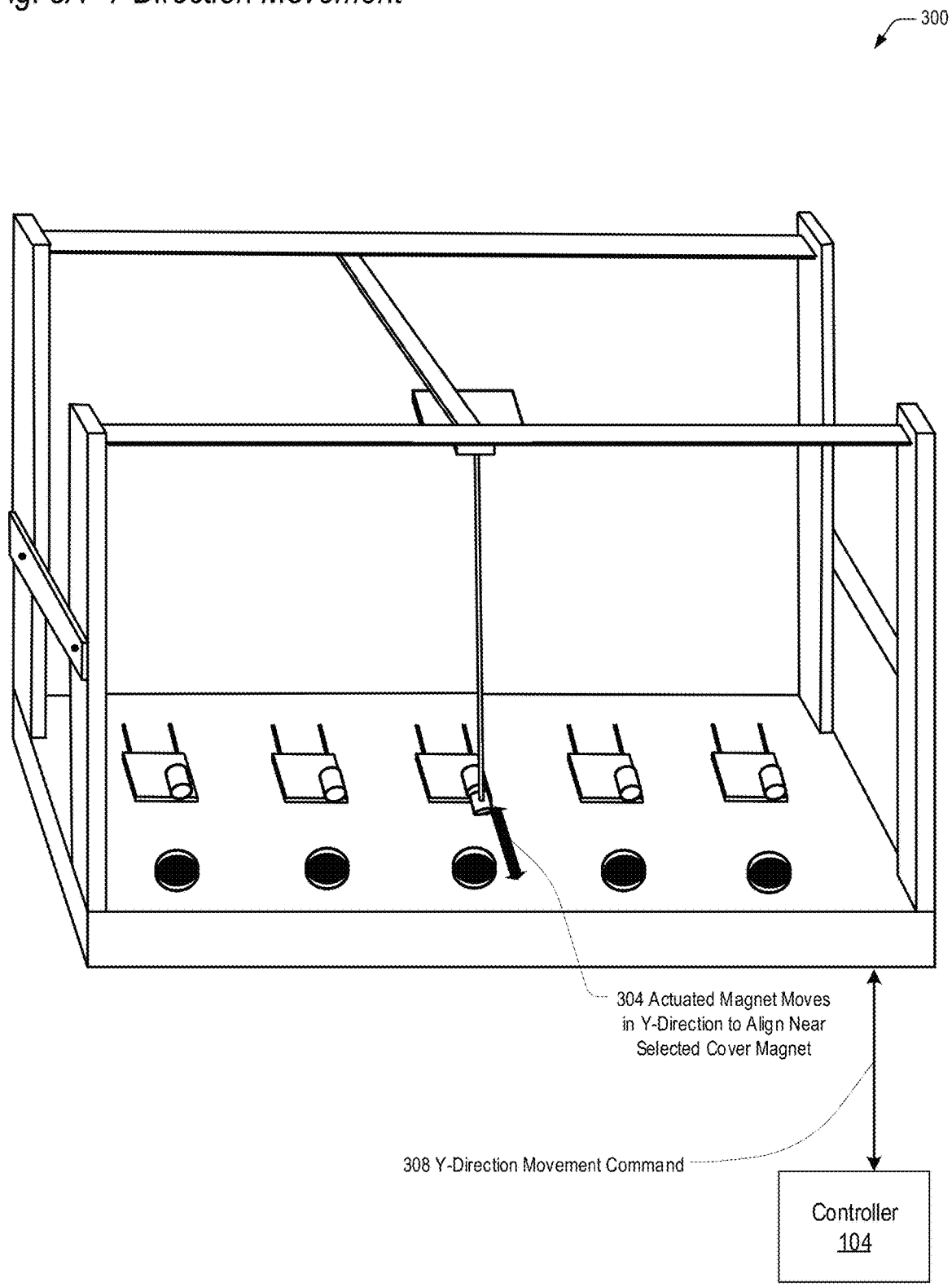

*Fig. 3B Y-Direction Movement*
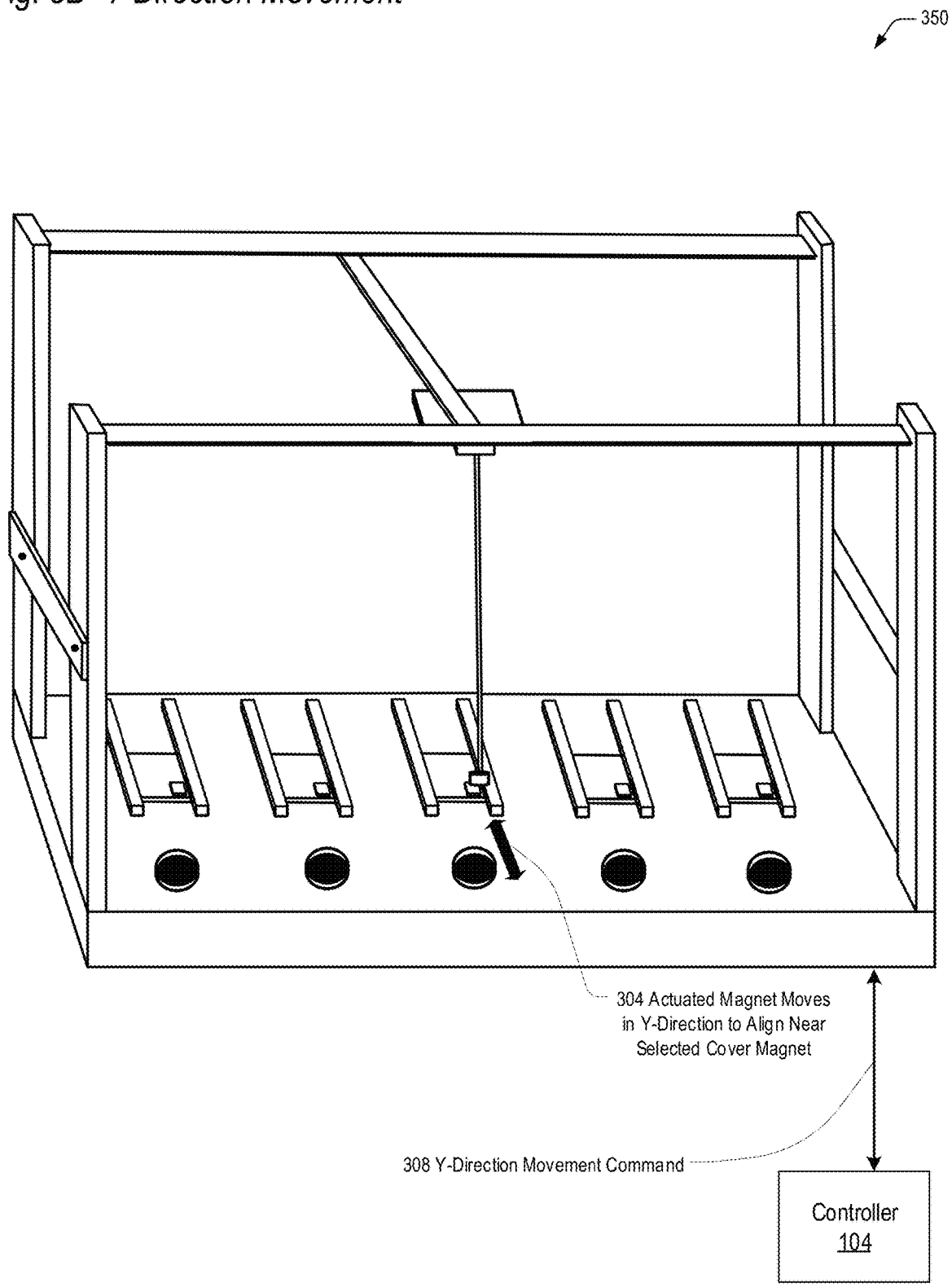

*Fig. 4A Cover Displacement by Magnet*
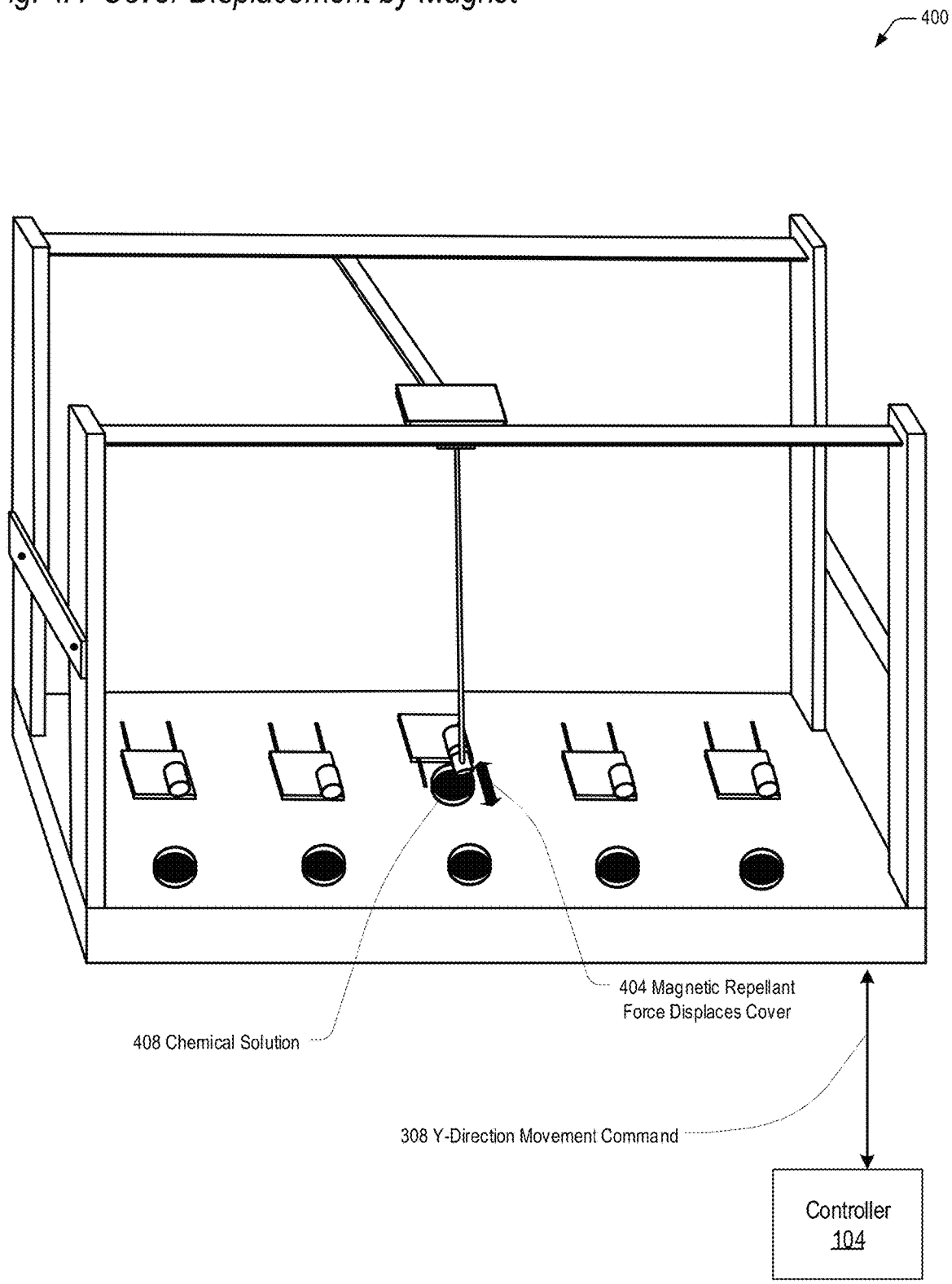

*Fig. 4B Cover Displacement by Magnet*
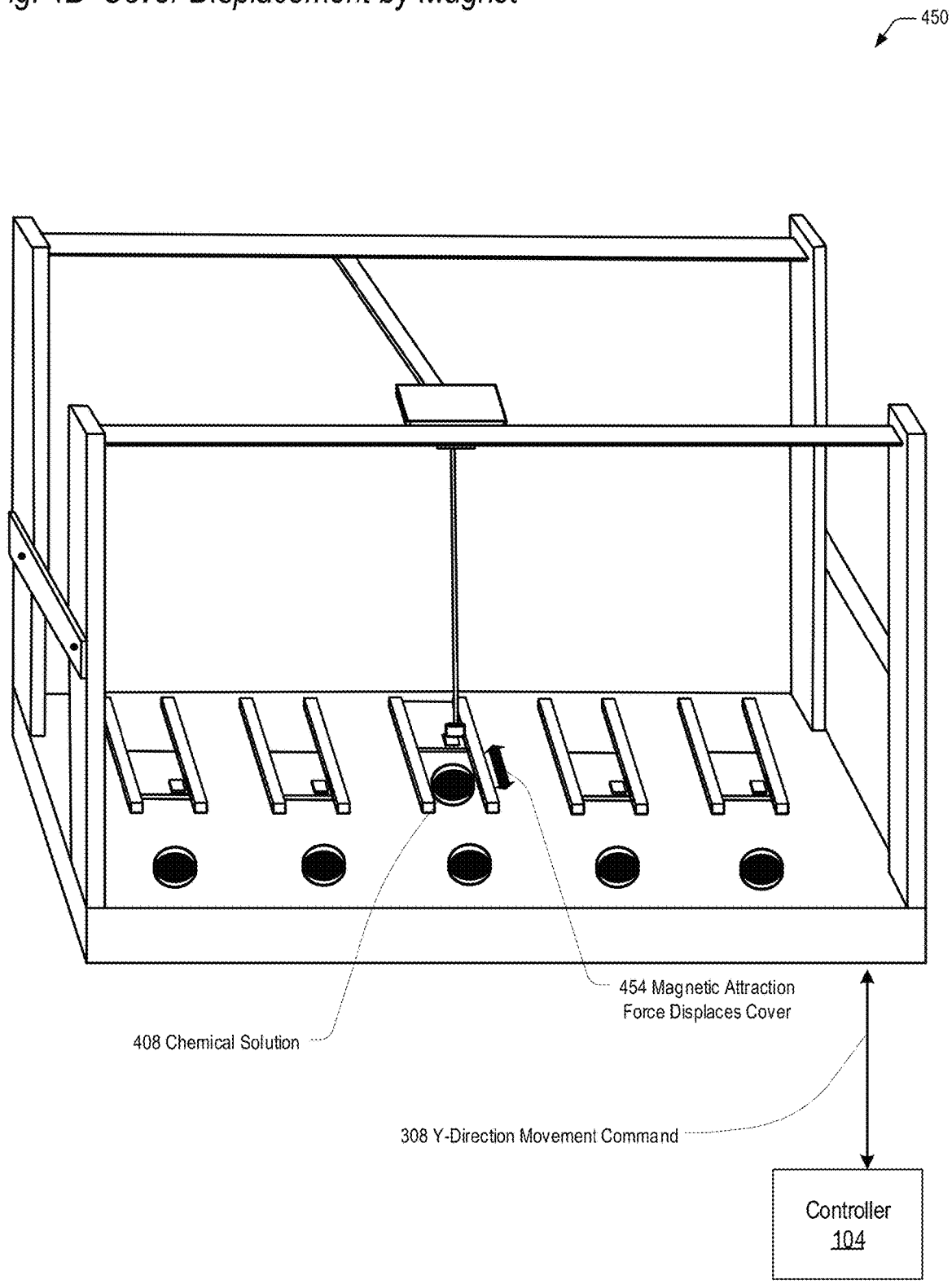

Fig. 5A  Cover in Closed Position
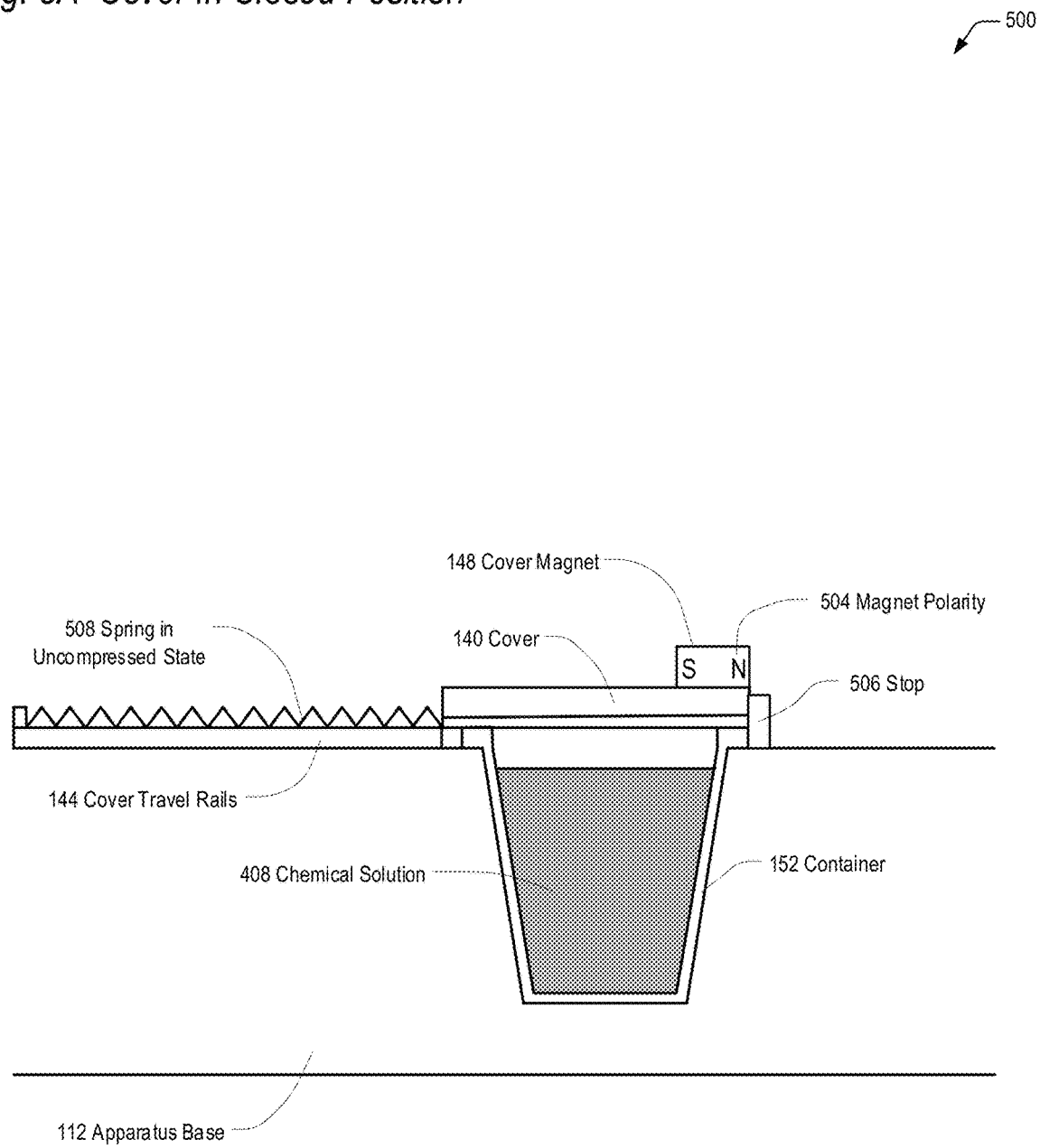

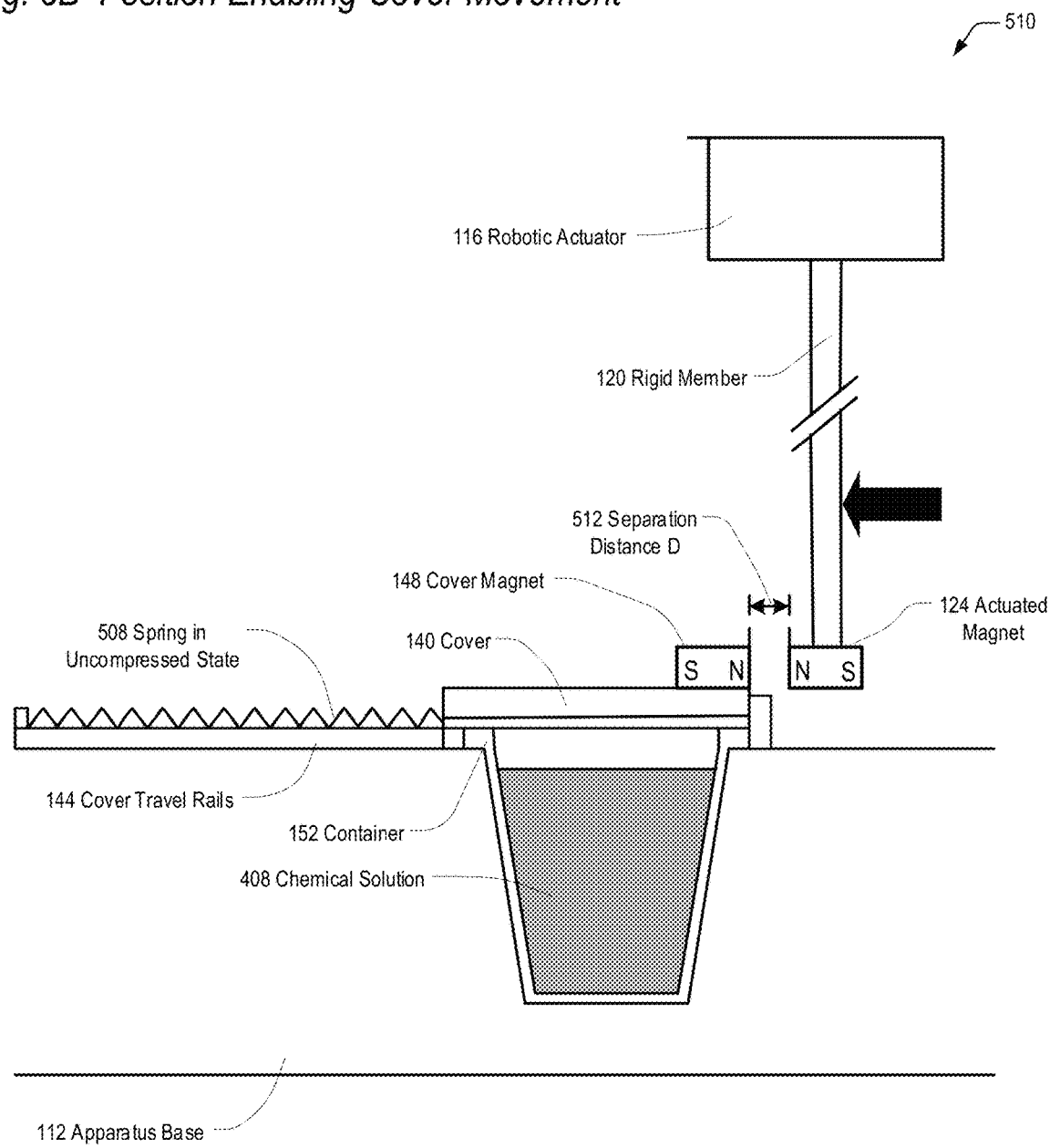
Fig. 5B Position Enabling Cover Movement

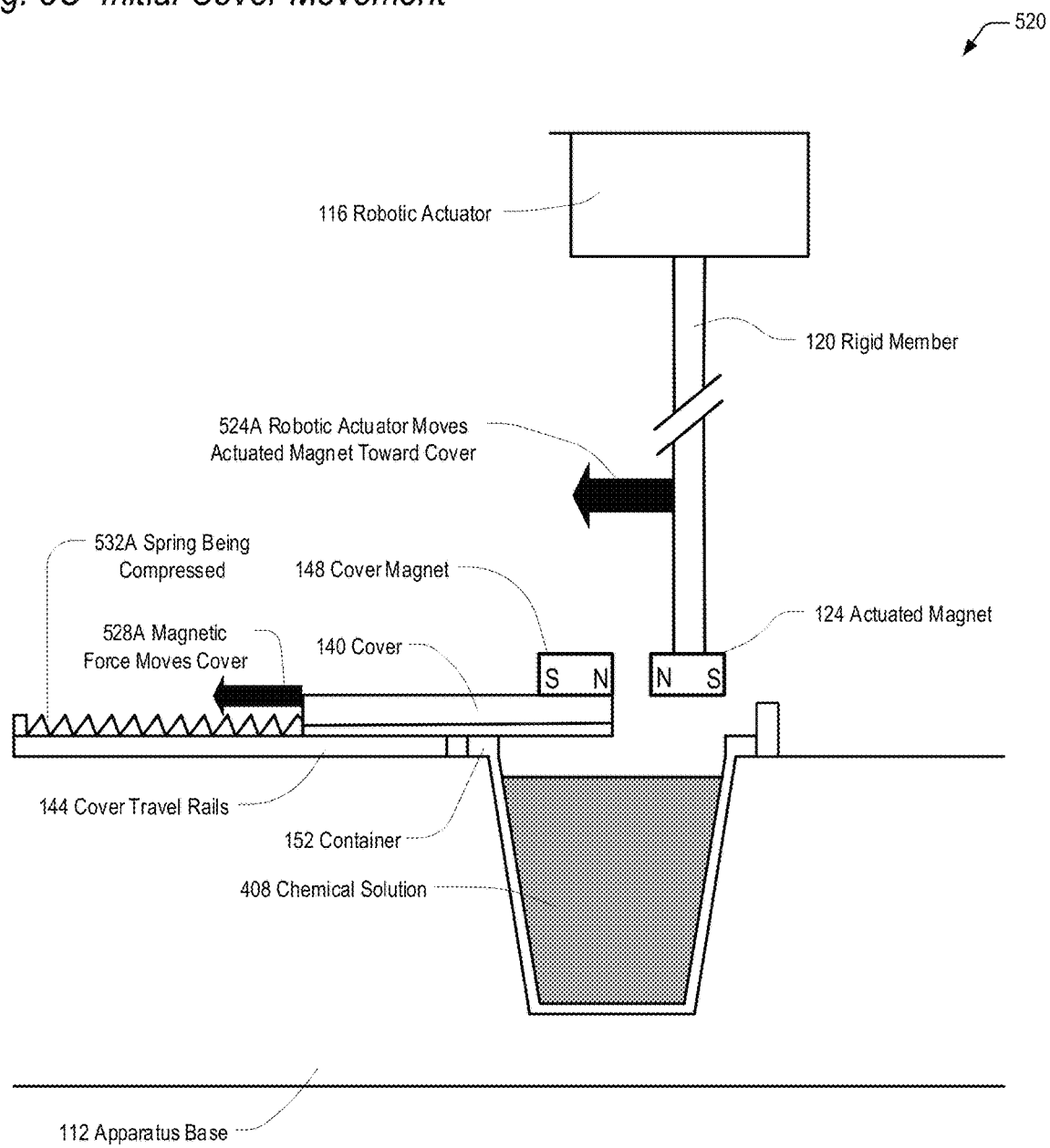
Fig. 5C Initial Cover Movement

*Fig. 5D Uncovered Chemical Solution*
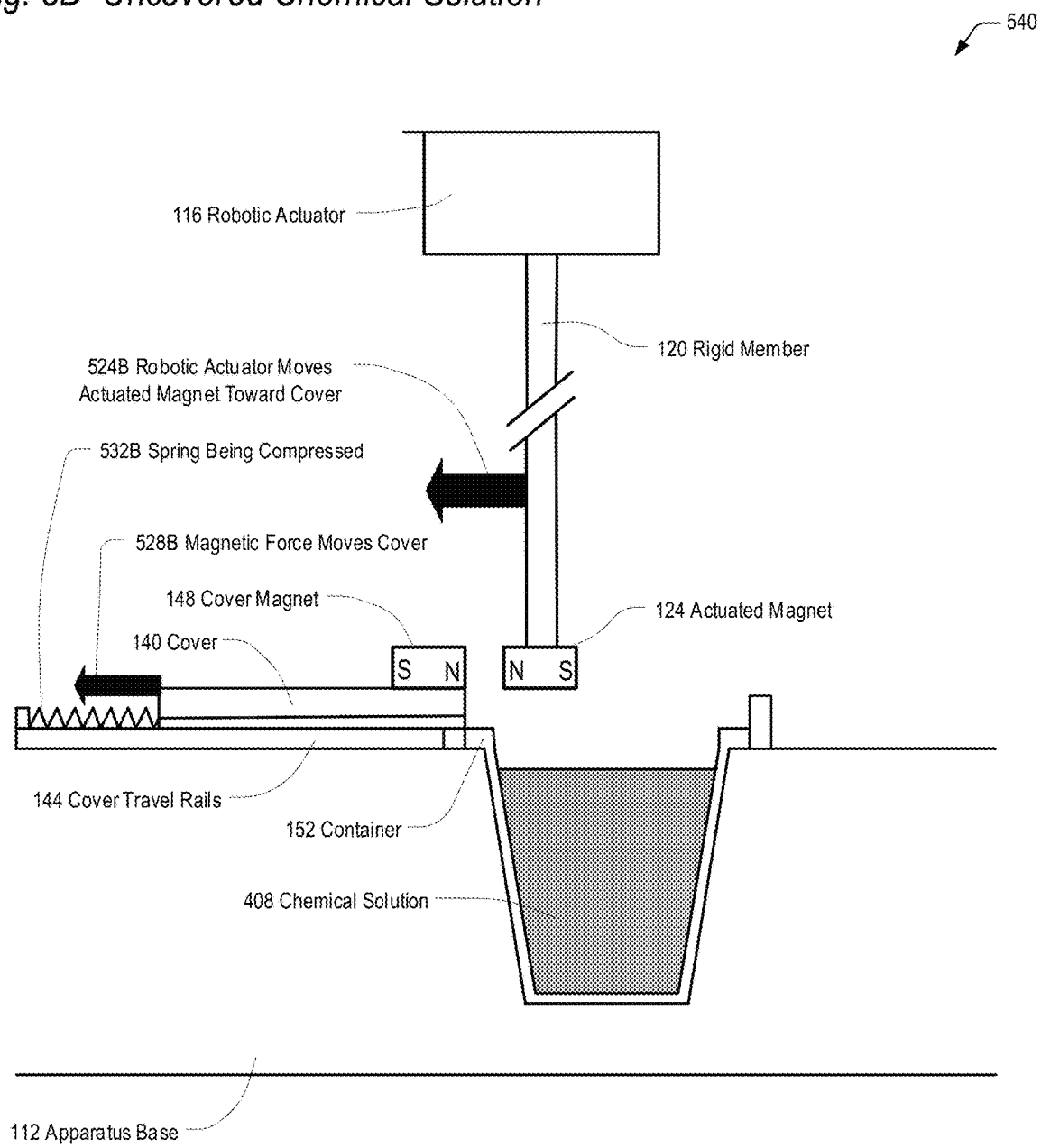

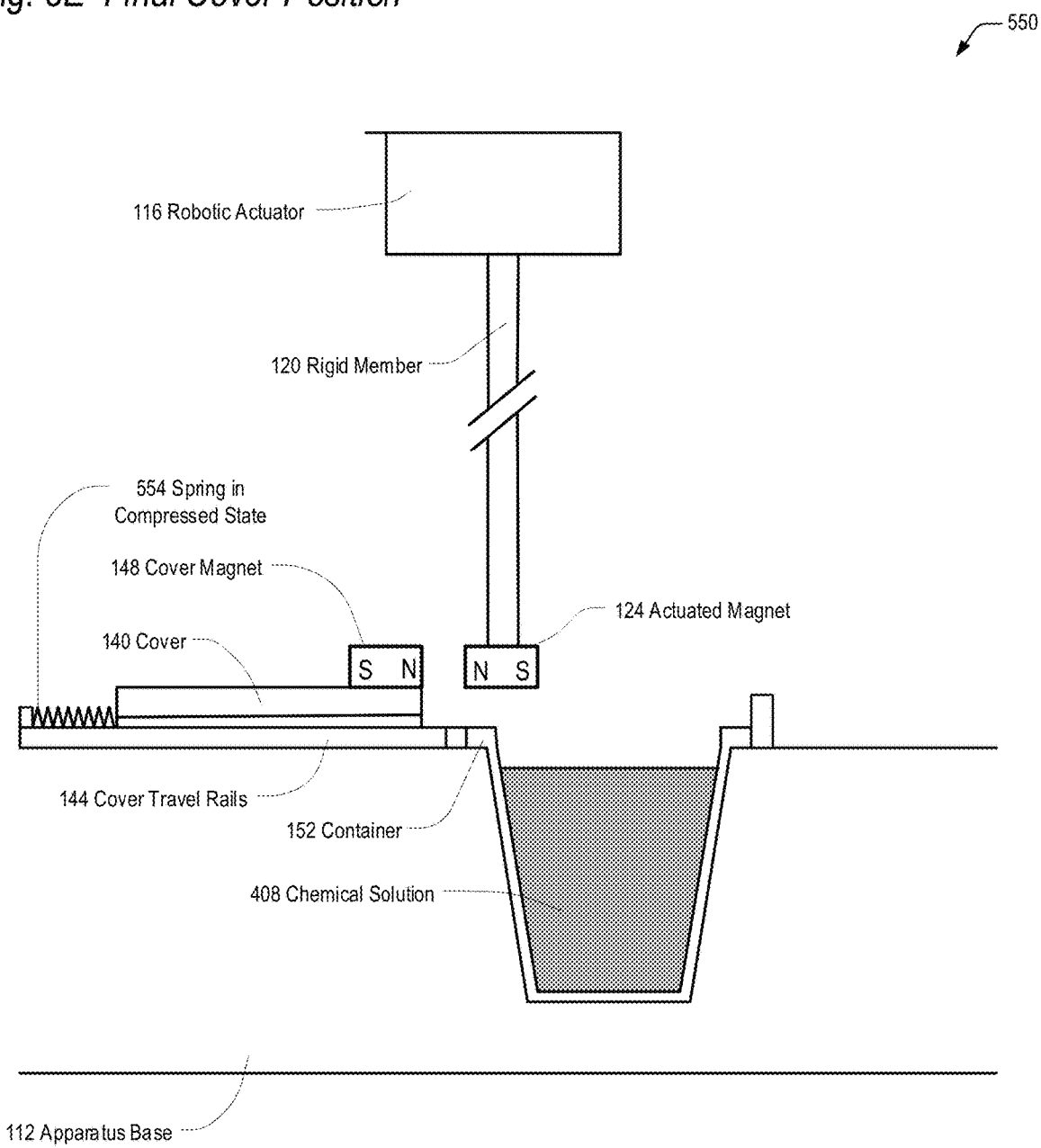
Fig. 5E Final Cover Position

Fig. 6A Cover in Closed Position
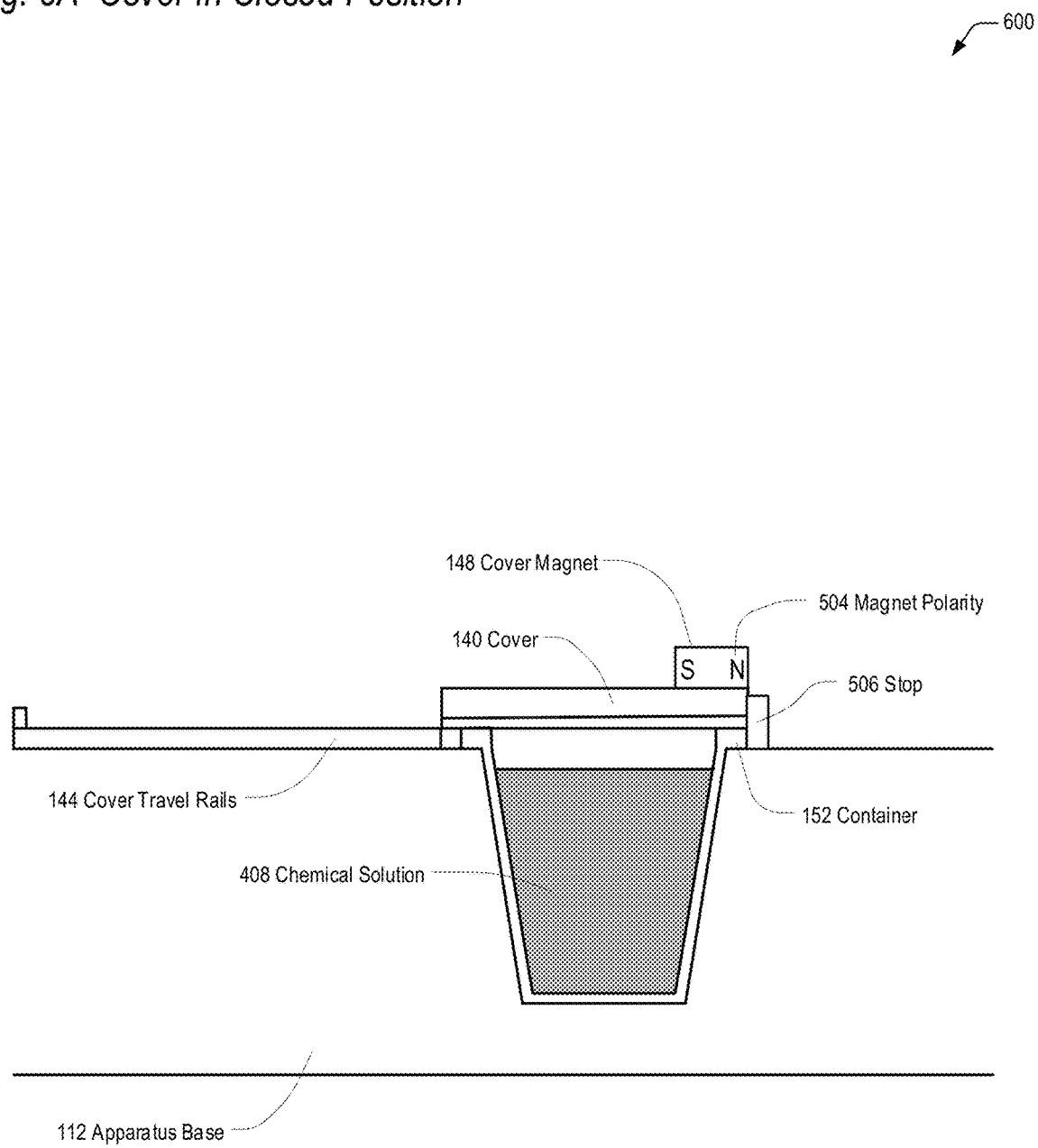

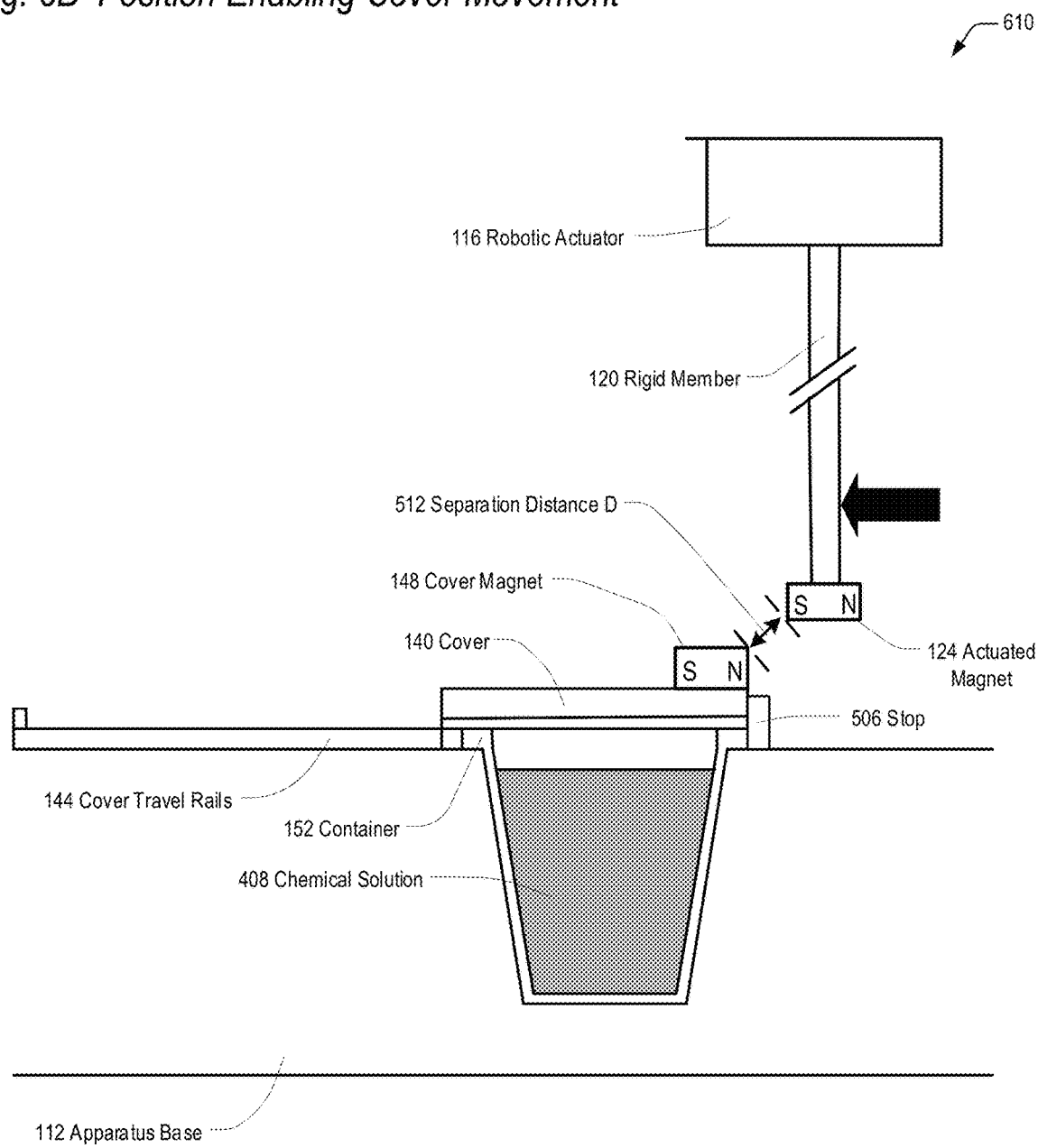
Fig. 6B Position Enabling Cover Movement

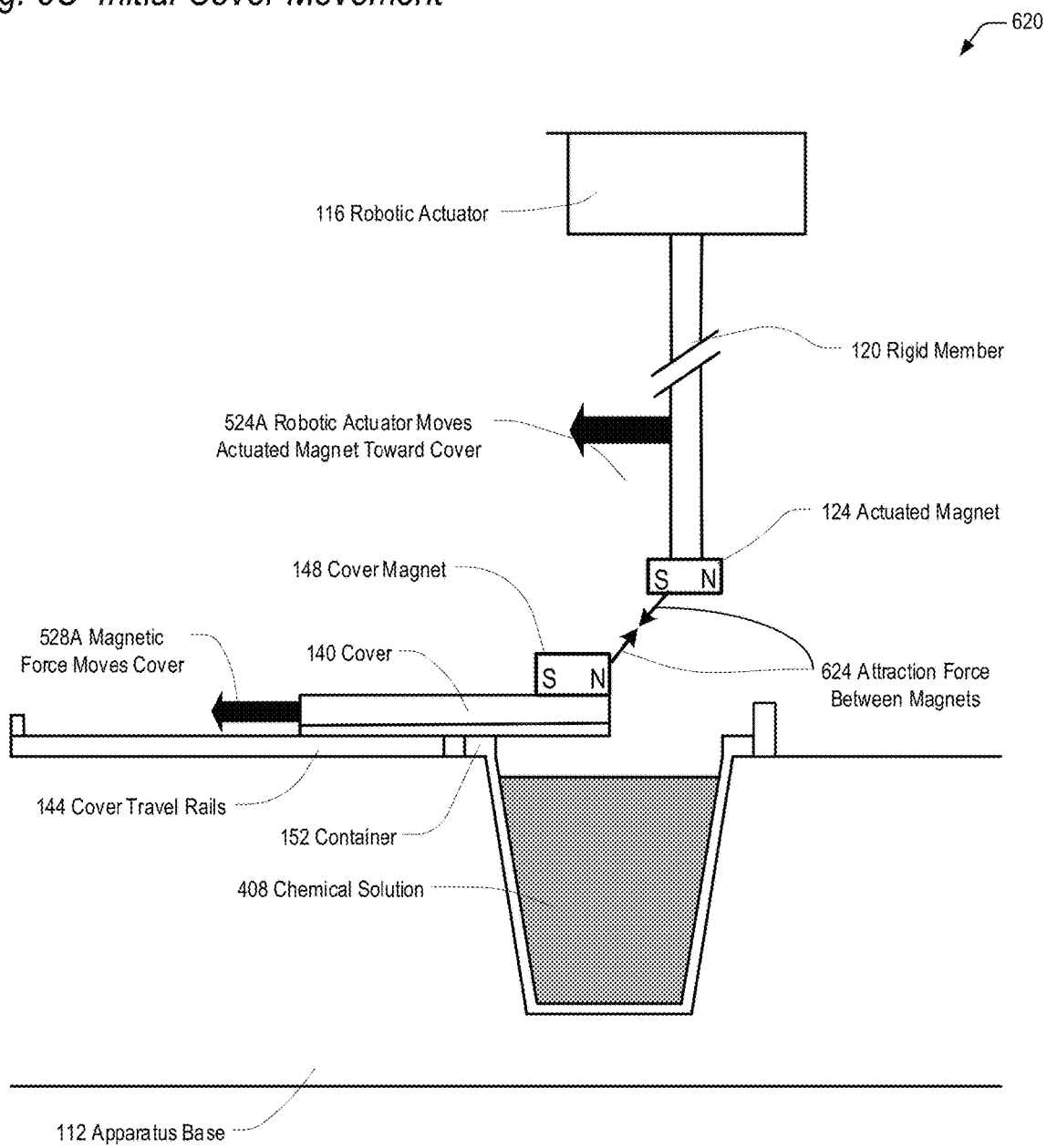
Fig. 6C Initial Cover Movement

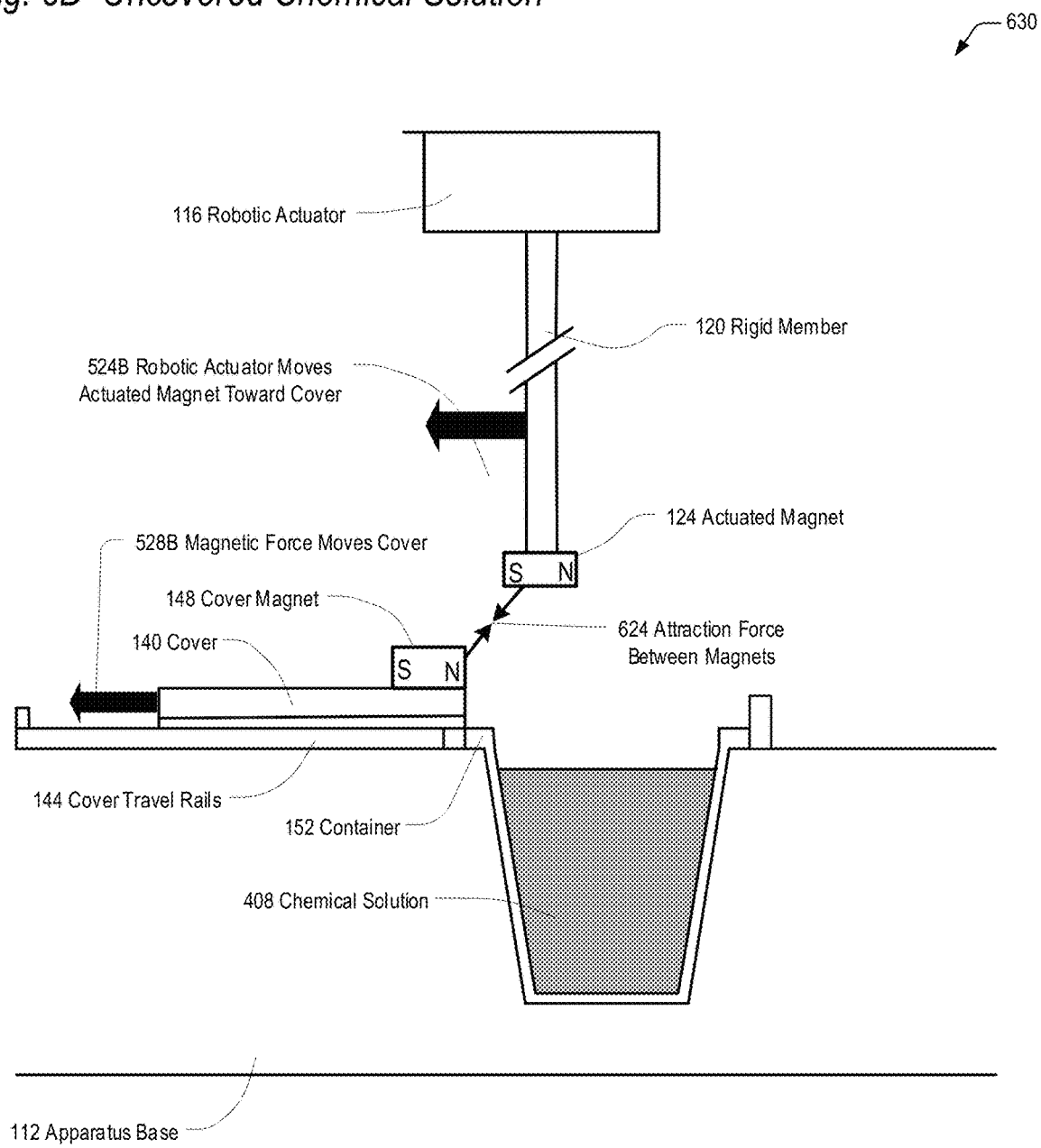
Fig. 6D Uncovered Chemical Solution

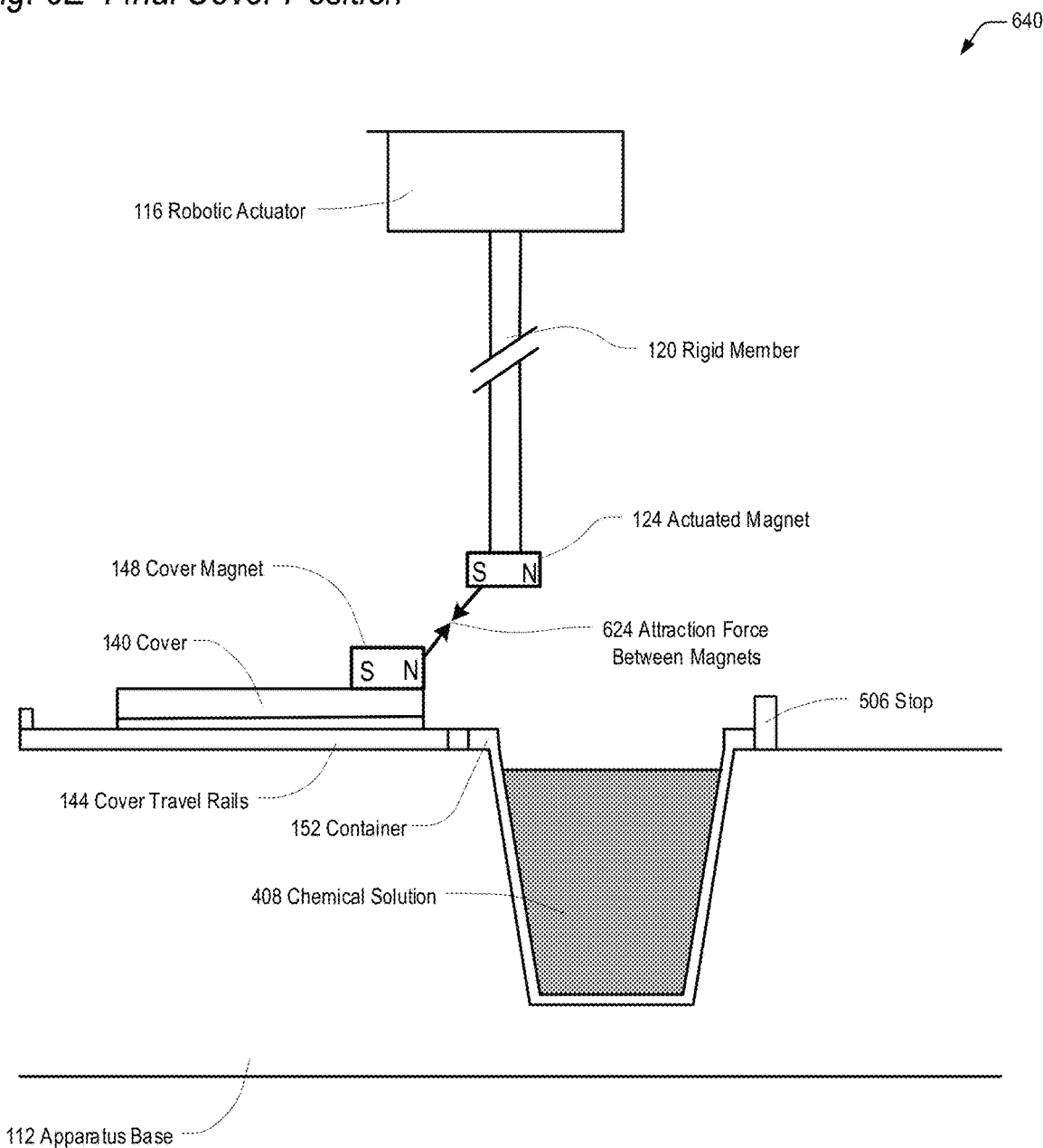
Fig. 6E Final Cover Position

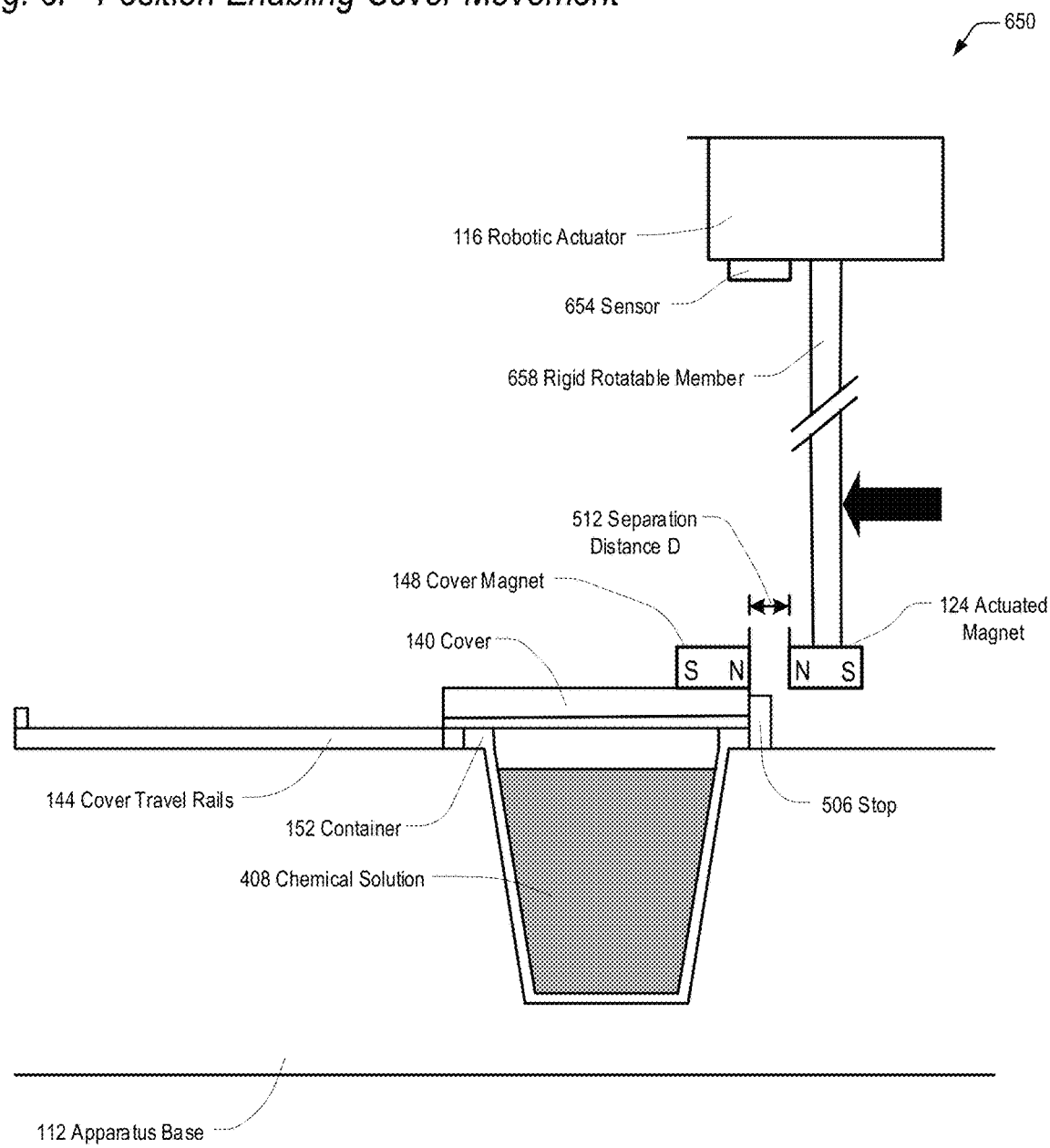
Fig. 6F Position Enabling Cover Movement

Fig. 6G  Initial Cover Movement
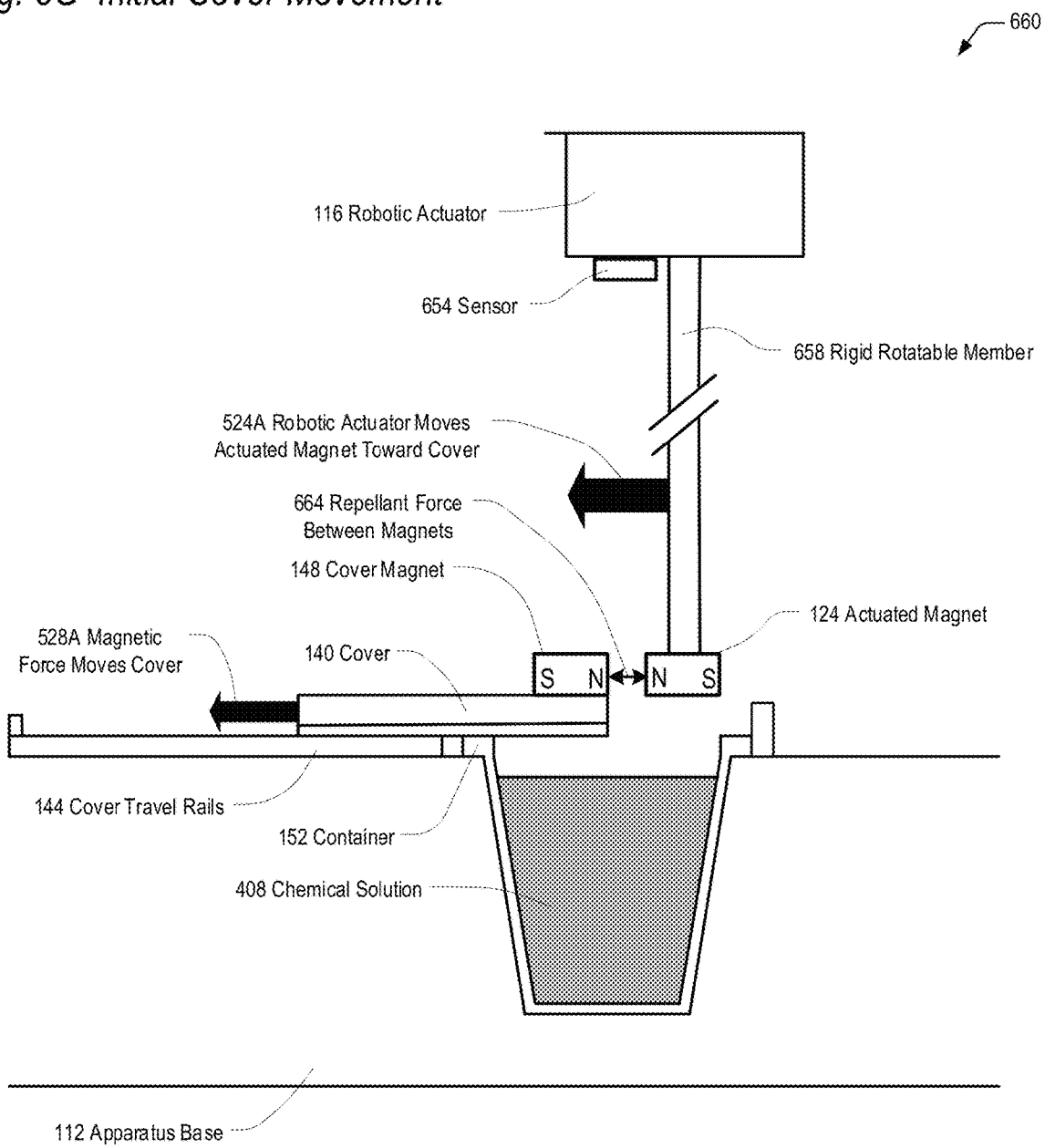

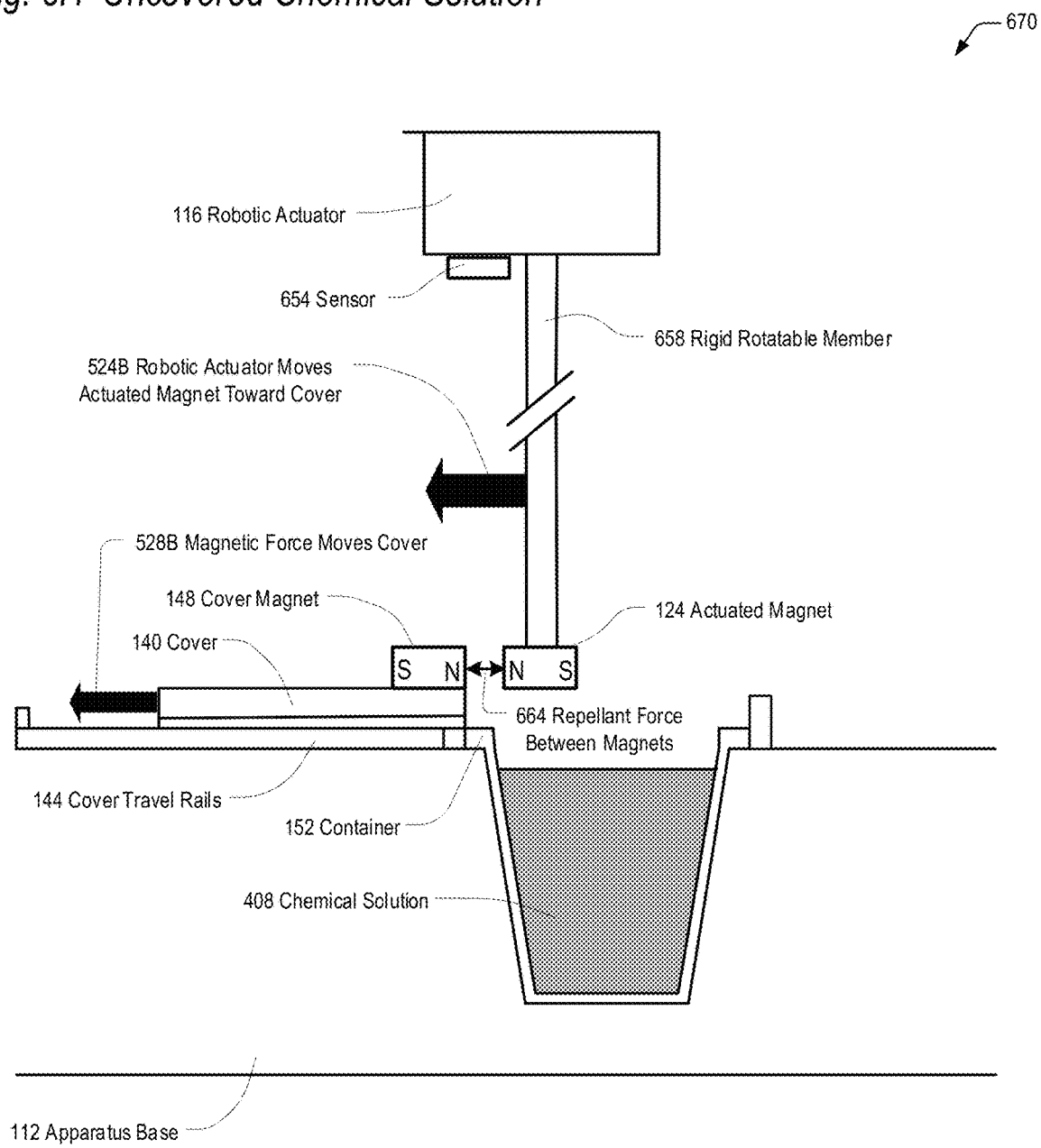
Fig. 6H Uncovered Chemical Solution

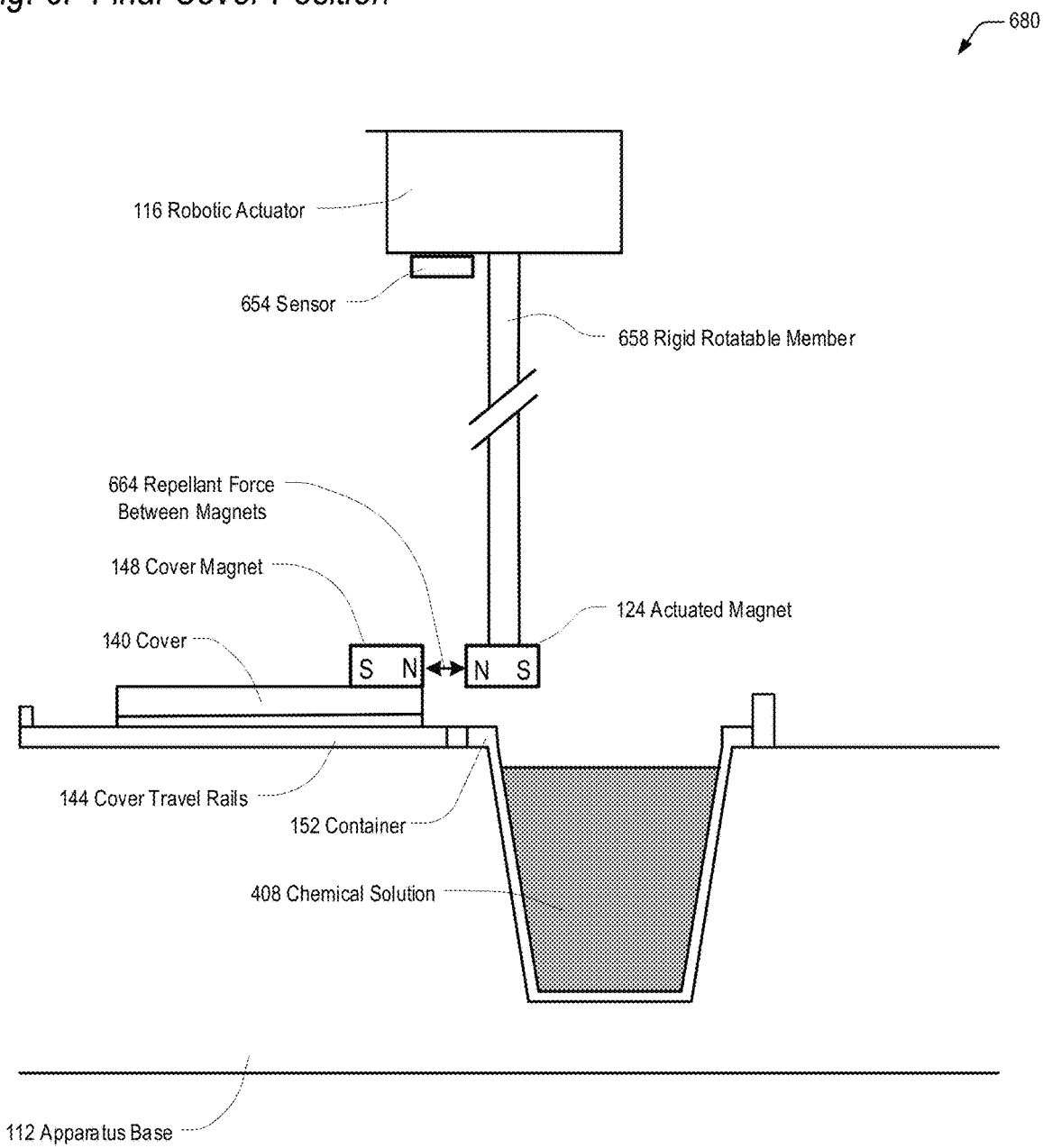
Fig. 6I Final Cover Position

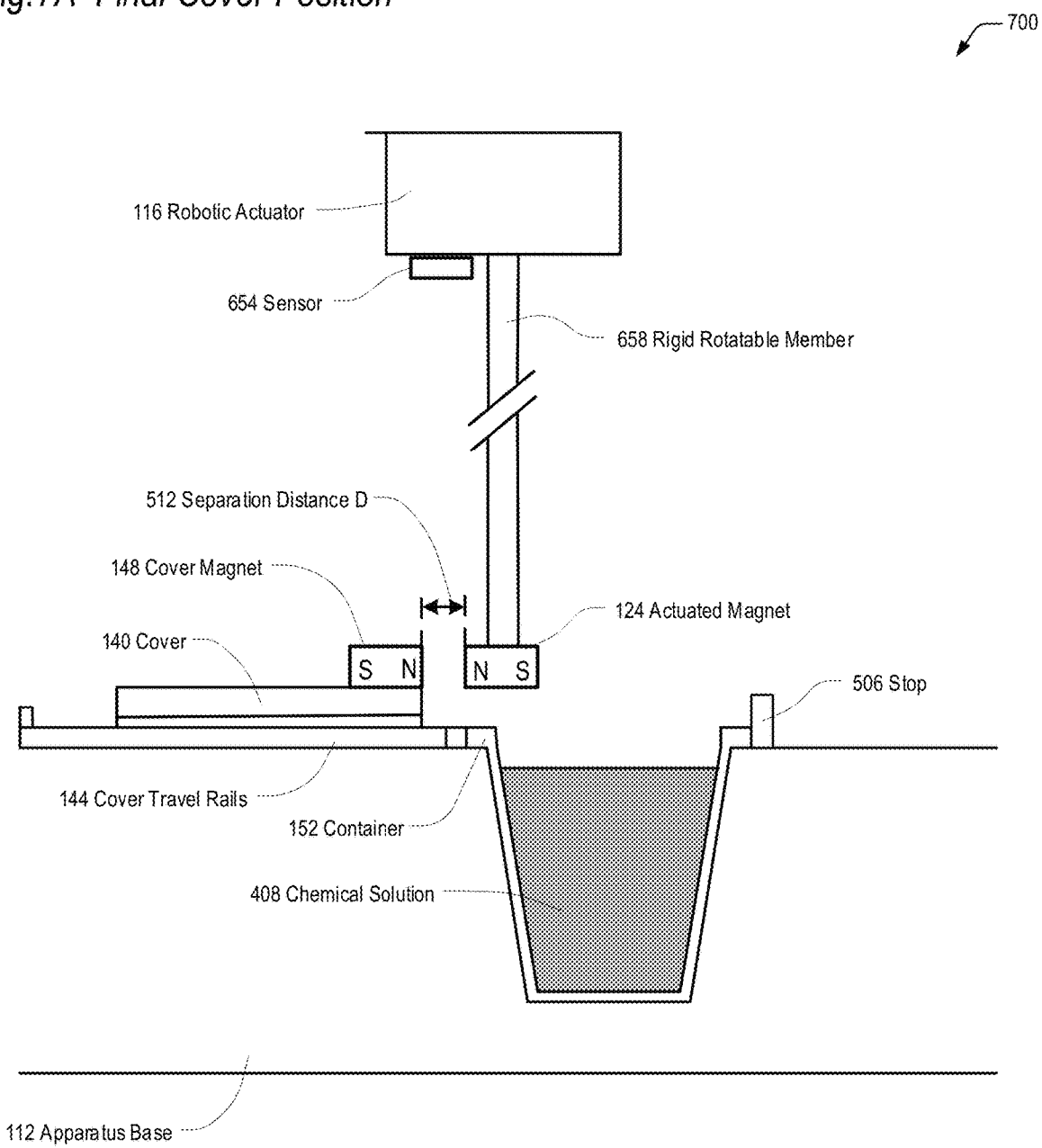
Fig.7A  Final Cover Position

*Fig.7B Rotate Actuated Magnet*
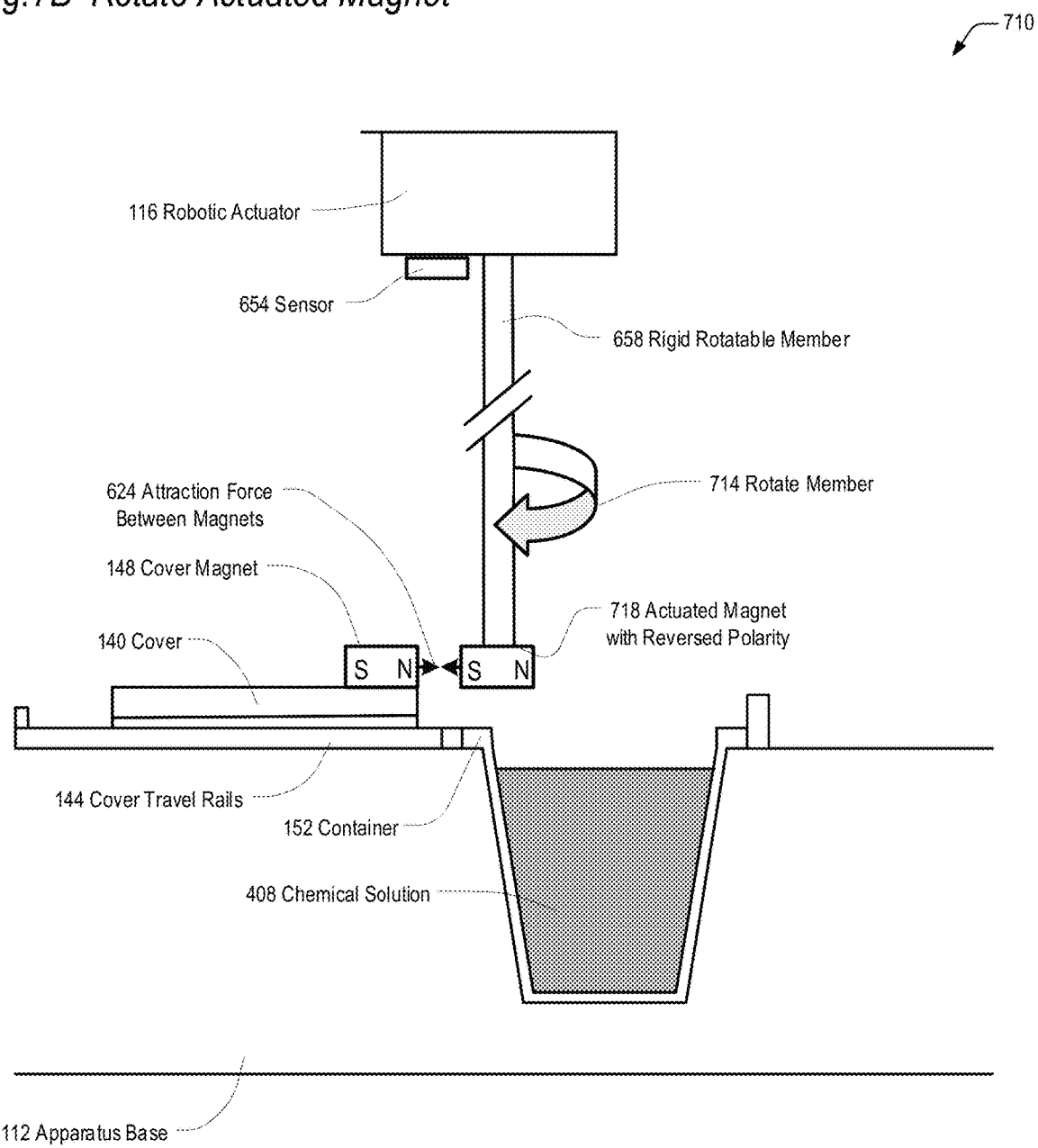

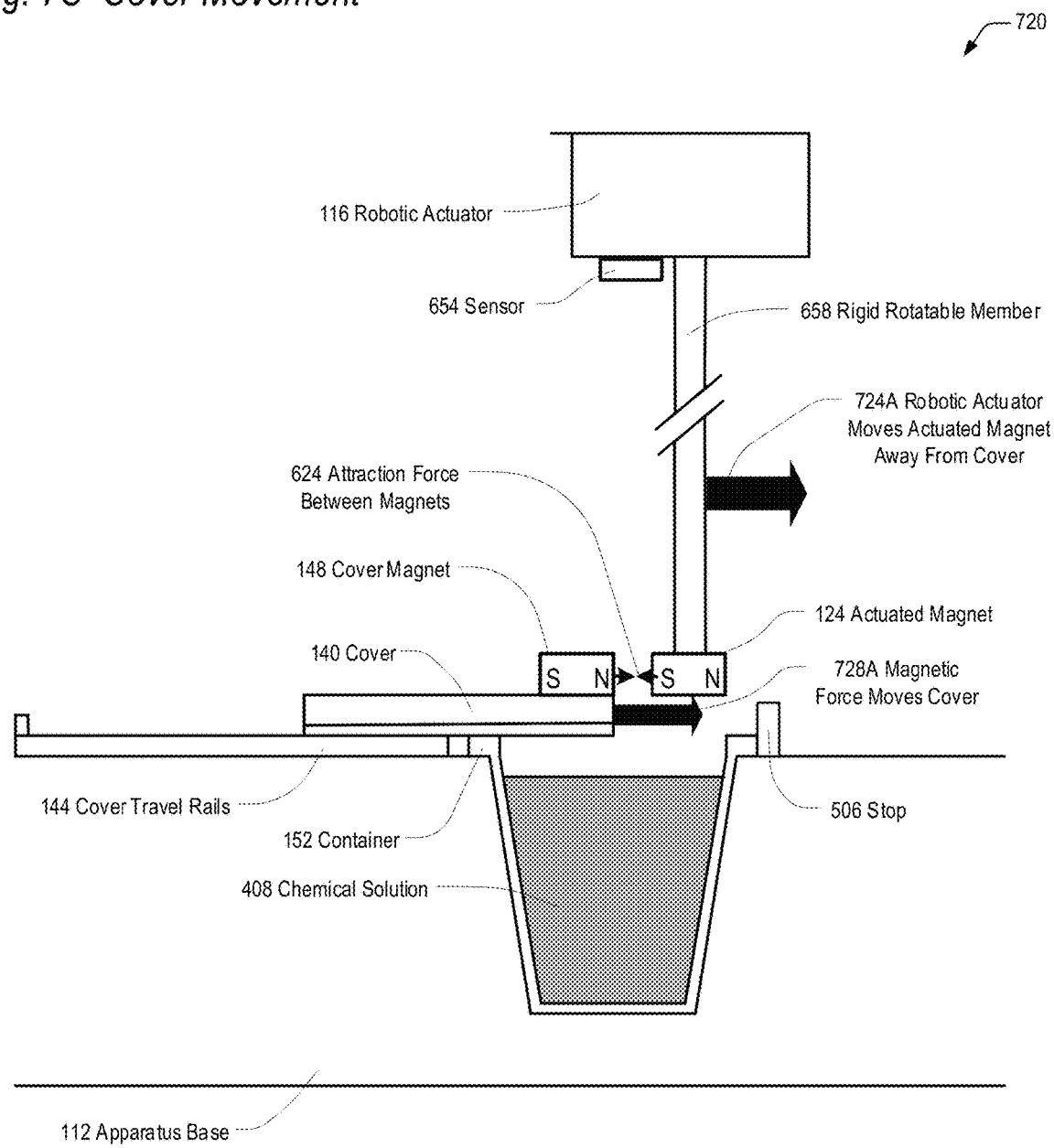
Fig. 7C Cover Movement

*Fig. 7D Final Cover Movement*
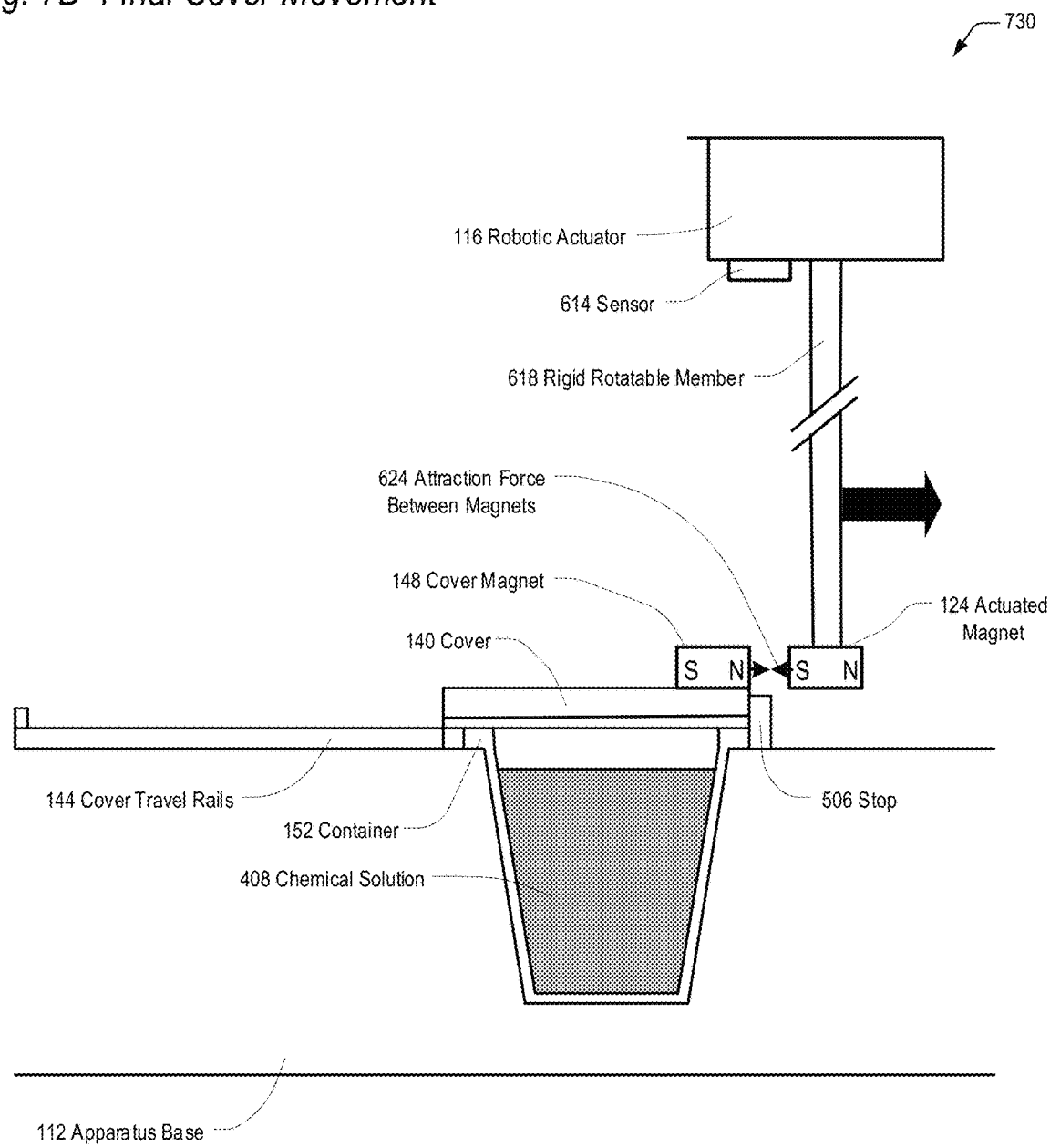

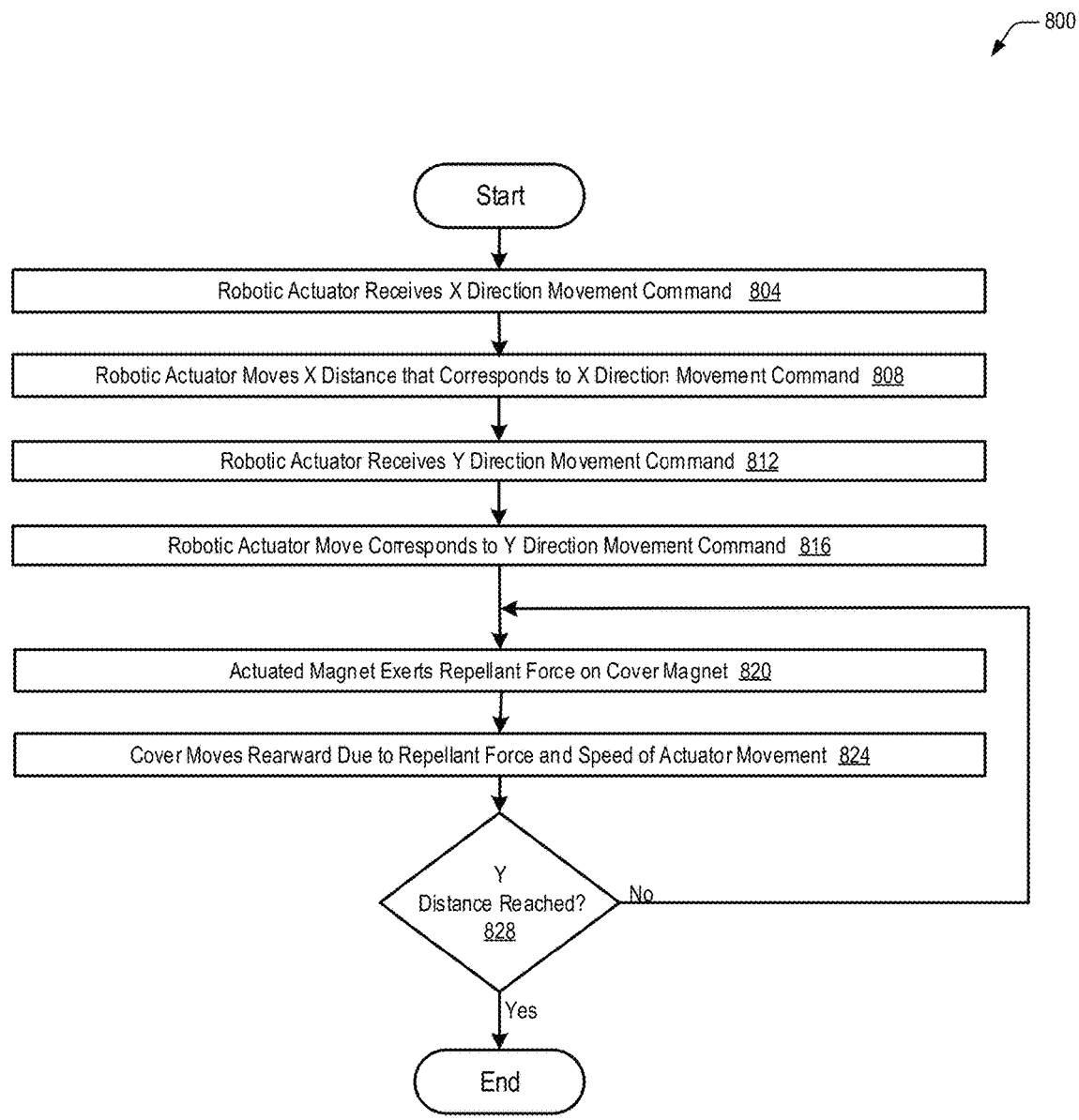
Fig. 8A  Cover Opening Process for Spring-Loaded Cover

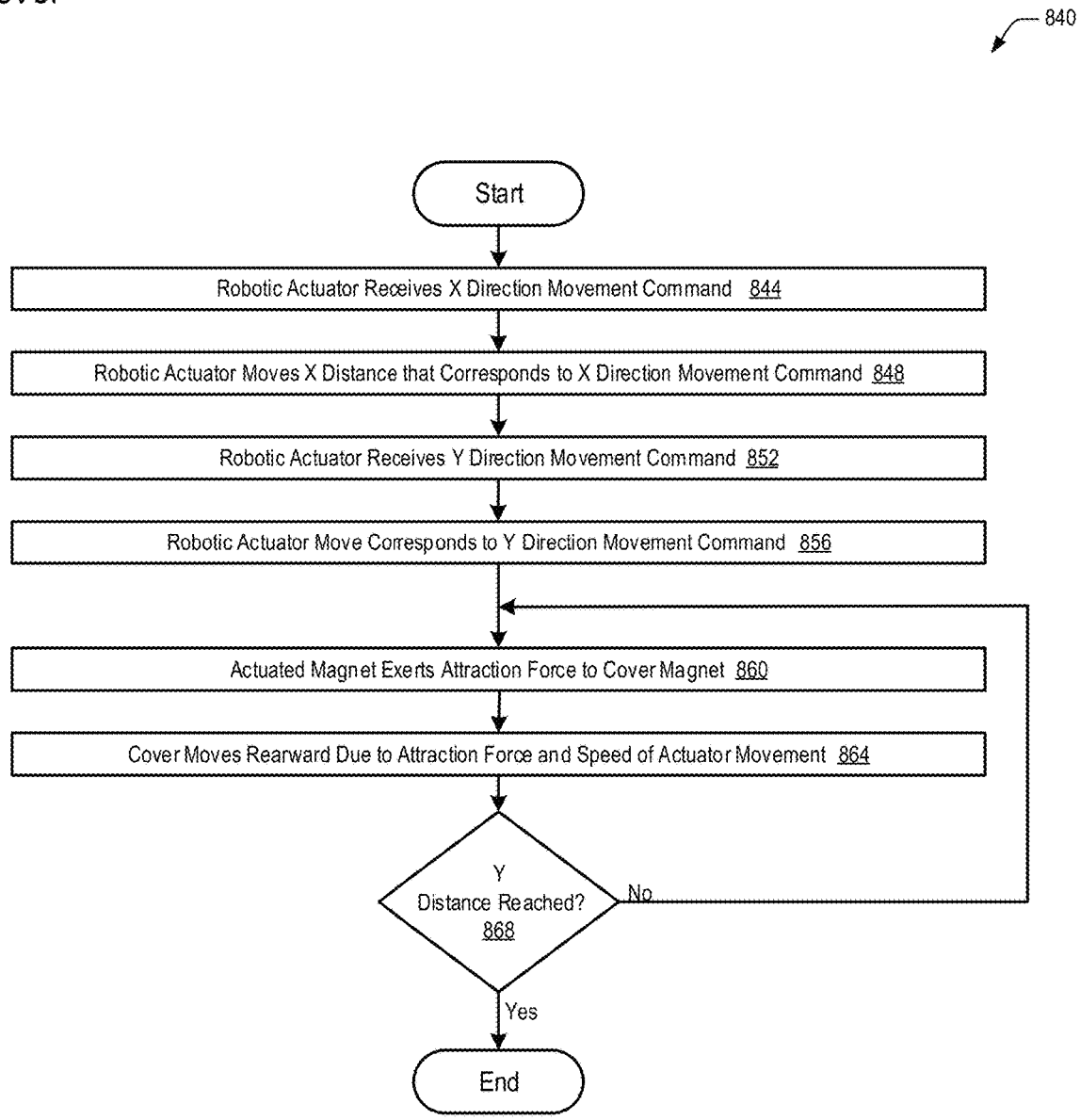

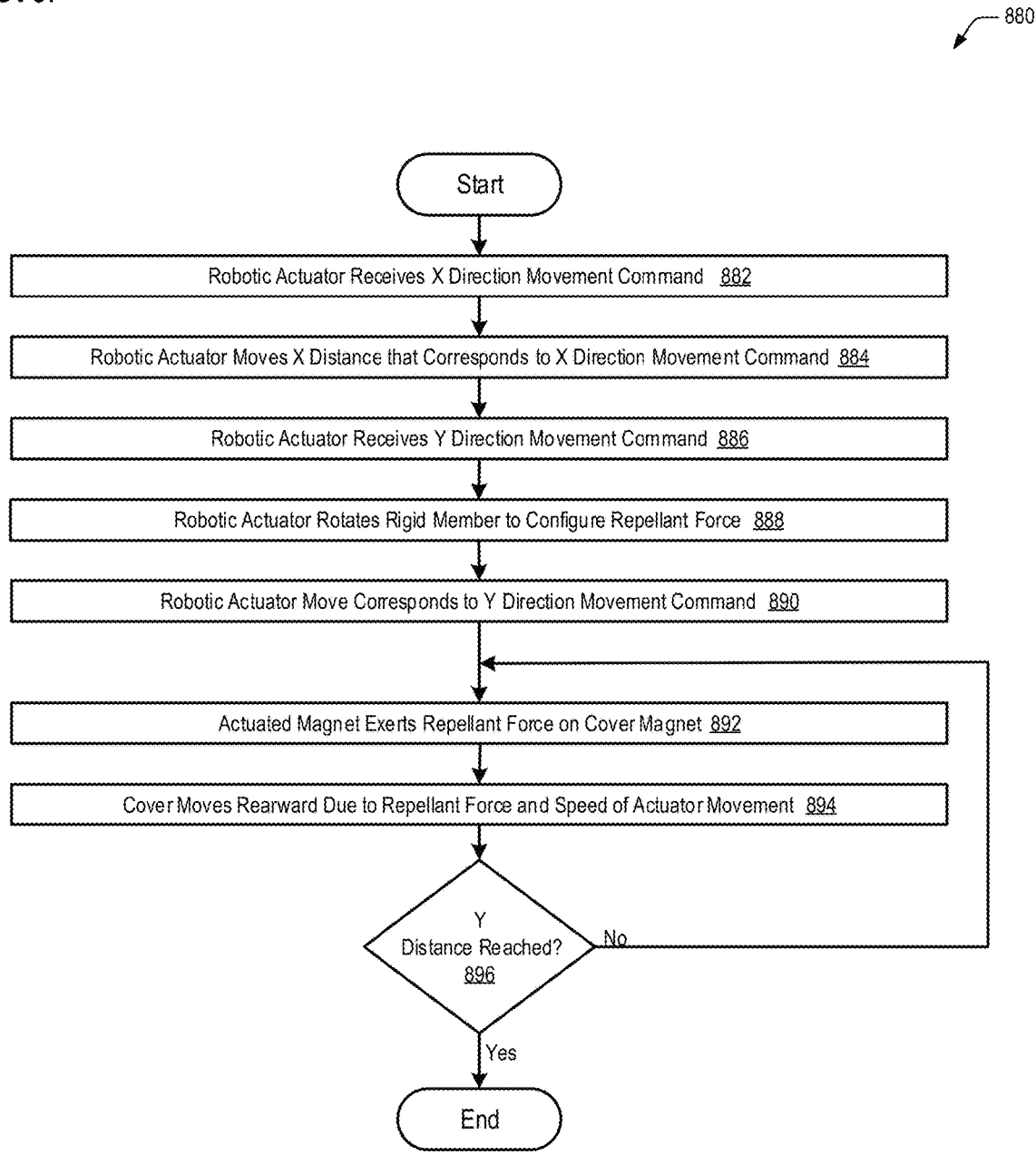
Fig. 8C Cover Opening Process Using Repellant Force for Free-Moving Cover

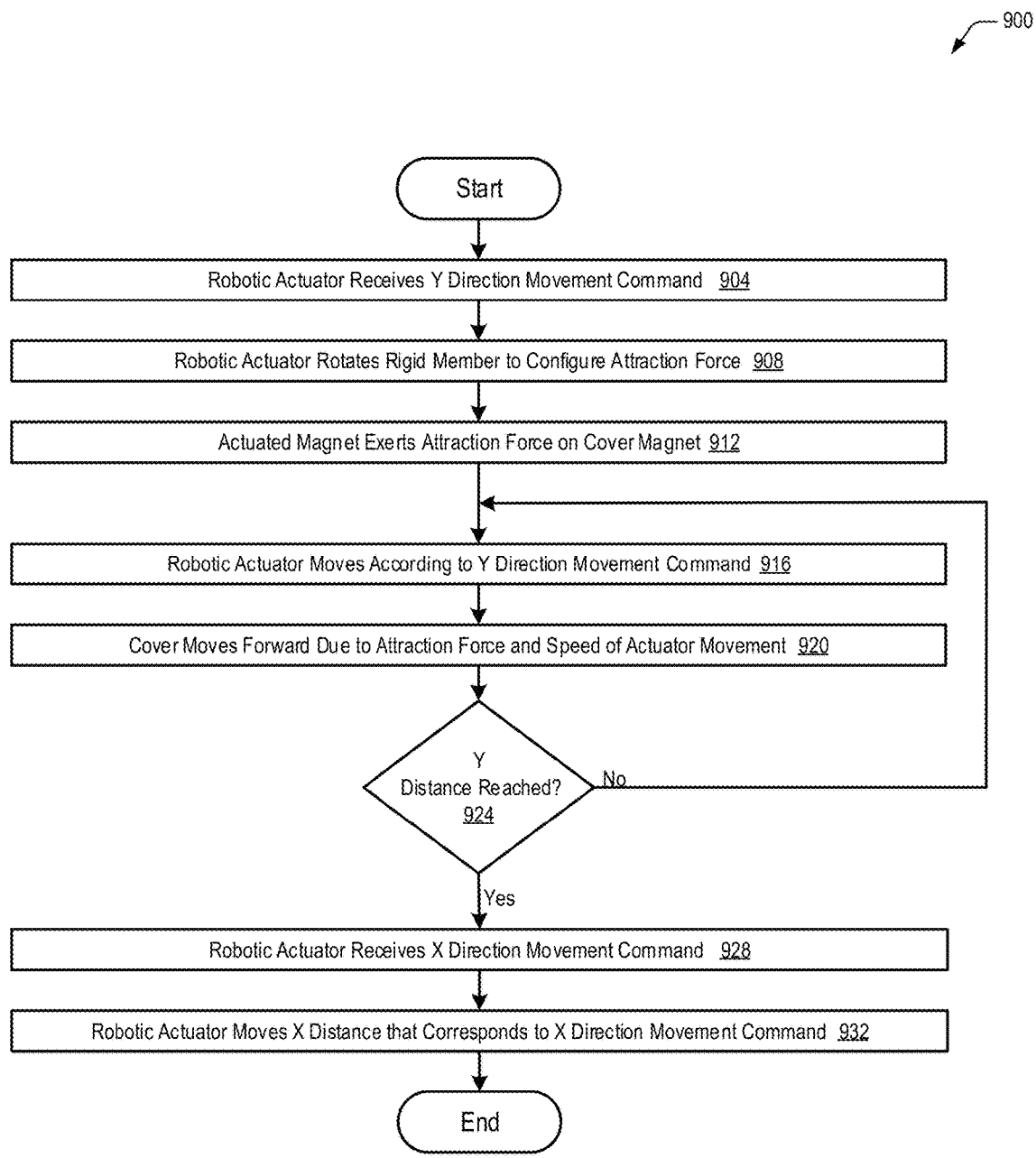
Fig. 9A  Cover Closing Process for Free-Moving Cover

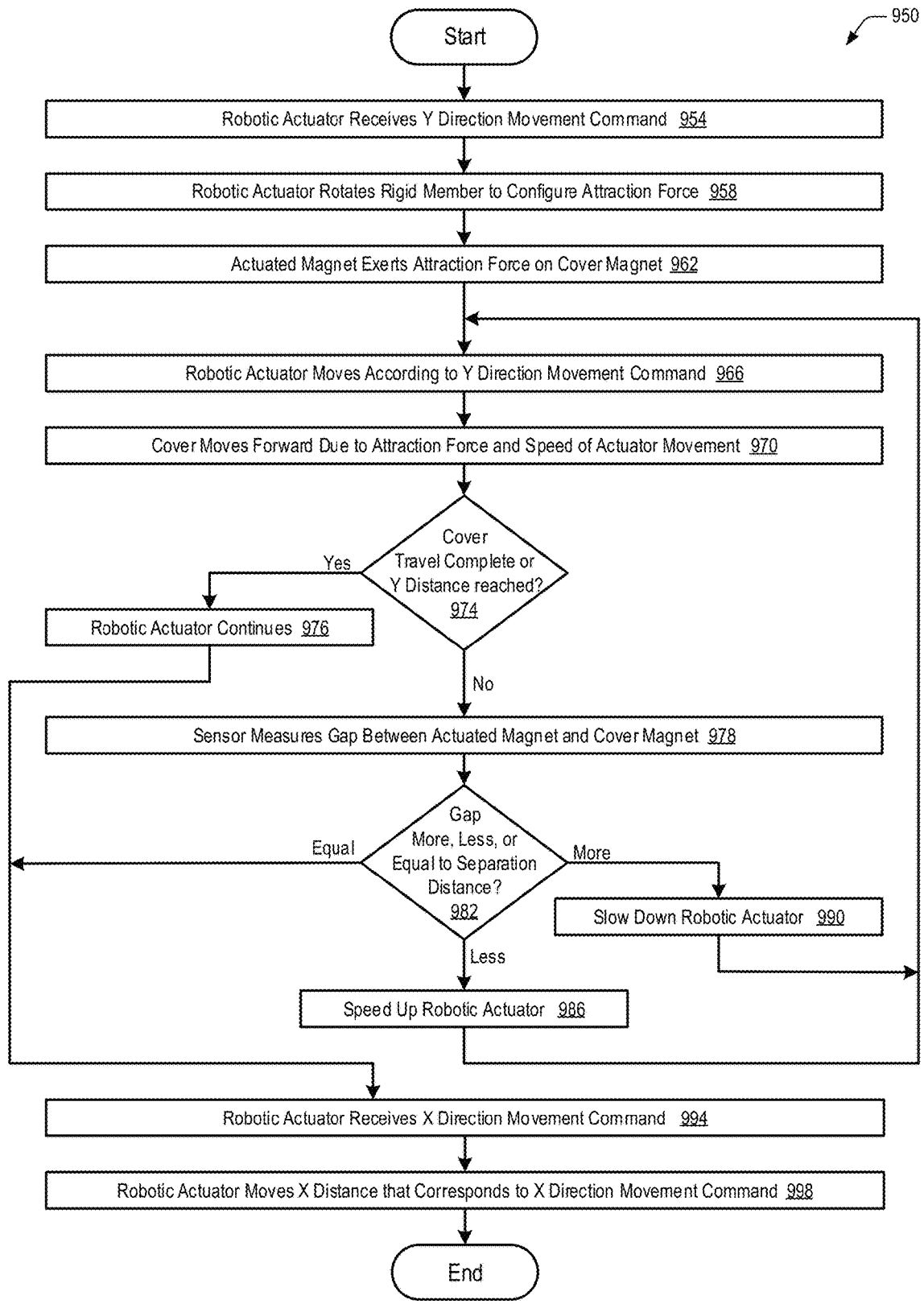
*Fig. 9B Cover Closing Process Using Sensor*

CHEMICAL EVAPORATION CONTROL SYSTEM

FIELD

The present invention is directed to apparatuses, systems, and methods for controlling evaporation in chemical processes. In particular, the present invention is directed to cover actuation for chemical solutions used in semiconductor processing.

BACKGROUND

Following semiconductor fabrication, it may be desired to continue to process one or more semiconductor dice with various chemical processes, for example to apply plating to die pads. Electroless plating, also known as chemical or auto-catalytic plating, is a non-galvanic plating method that involves several simultaneous reactions in an aqueous solution, which occur without the use of external electrical power. The reaction is accomplished when hydrogen is released by a reducing agent, normally sodium hypophosphite (Note: the hydrogen leaves as a hydride ion) or thiourea, and oxidized, thus producing a negative charge on the surface of the device. The most common electroless plating method is electroless nickel plating, although silver, gold, palladium, and copper layers may also be applied in this manner.

Electroless nickel plating, also known as enickel and NiP, offers many advantages: uniform layer thickness over most complicated surfaces, direct plating of ferrous metals (steel), superior wear, and corrosion resistance compared to electroplated nickel or chrome. Much of the chrome plating performed in the aerospace industry can be replaced with electroless nickel plating. Environmental costs, costs of hexavalent chromium waste disposal, and notorious tendency of uneven current distribution may favor electroless nickel plating. Electroless nickel plating is a self-catalyzing process. The resultant nickel layer is a NiP compound, with 7-11% phosphorus content. Properties of the resultant layer hardness and wear resistance are greatly altered with bath composition and deposition temperature, which should be regulated with 1 C precision, typically at 91 C. During bath circulation, any particles in it will become also nickel-plated; this effect is used to advantage in processes which deposit plating with particles like silicon carbide (SiC) or polytetrafluoroethylene (PTFE). While superior compared to many other plating processes, it is expensive because the process is complex. Moreover, the process is lengthy even for thin layers. When only corrosion resistance or surface treatment is of concern, very strict bath composition and temperature control may not be required and the process may be used for plating many tons in one bath at once.

Electroless nickel plating layers are known to provide extreme surface adhesion when plated properly. Electroless nickel plating is non-magnetic and amorphous. Electroless nickel plating layers are not easily solderable, nor do they seize with other metals or another electroless nickel-plated workpiece under pressure. This effect benefits electroless nickel-plated screws made out of malleable materials like titanium. Finally, electrical resistance may be higher compared to pure metal plating.

SUMMARY

In accordance with an embodiment of the present invention, an apparatus is provided. The apparatus may include one or more of a container, a first magnet assembly, and a second magnet assembly. The container includes an open top and is configured to hold a chemical solution. The first magnet assembly includes a first magnet having a first polarity and a cover, coupled to the first magnet. The cover is configured to be movable between an open and a closed position and limit evaporation of the solution when the cover is in the closed position. The second magnet assembly includes a second magnet having a second polarity. In response to a command, the second magnet assembly is configured to move the cover to the open position without direct contact to the first magnet assembly.

In accordance with another embodiment of the present invention, a system is provided. The system may include a controller, an open-top container configured to hold a chemical solution, a cover, a first magnet coupled to the cover, a second magnet, and an actuator coupled to the second magnet and the controller. The cover is configured to slide over the top of the container between open and closed positions and limit evaporation of a chemical solution when in the closed position. The second magnet is configured to provide an attraction force to the first magnet in response to a predetermined separation distance and opposite polarities between the first and second magnets and provide a repellant force to the first magnet in response to the predetermined separation distance and same polarities between the first and second magnets. The actuator is coupled to the second magnet and the controller, and is configured to receive movement commands from the controller to move the second magnet relative to the first magnet.

In accordance with yet another embodiment of the present invention, a method is provided. The method may include one or more of receiving, by an actuator, a command to move a cover over a container from a closed position to an open position, moving a second magnet coupled to the actuator to a predetermined separation distance from the first magnet, moving the second magnet toward the first magnet and in response moving, by the first magnet, the cover to the open position. The container includes an open top and is configured to hold a solution. The cover is coupled to a first magnet having a first polarity. The second magnet is configured to provide one of an attraction force and a repellant force to the first magnet.

An advantage of the present invention is it provides a system for limiting or eliminating solution evaporation during semiconductor processes. Solutions may be typically only occasionally accessed, during one step of a multi-step process. For times other than when a solution is being accessed, it is desirable to cover the solution accordingly, preferably without direct human contact.

Another advantage of the present invention is provides physical movement of a cover over a solution without direct physical contact between a moving apparatus and the cover. The present invention uses magnetic attraction or repellant force between non-touching magnets to move a cover from a closed position to an open position, and in some embodiments, a magnetic attraction force between the magnets to move from the open position to the closed position. Because of the lack of touching or direct contact, a spark danger may be minimized, which may improve safety with regard to flammable chemical solutions.

Yet another advantage of the present invention is it provides variable polarity reversal between the cover magnet and the actuated magnet. The polarity of the actuated magnet compared to the cover magnet may be reversed by rotating an actuator coupled to the actuated magnet. Additionally, the degree of attraction or repellant force may be varied by adjusting the angular relationship between the actuated magnet compared to the cover magnet. Attraction/repellant force is maximized when the poles of the magnets are exactly coincidental, and reduced as the actuated magnet angle is rotated toward either 90 or 270 degrees.

Additional features and advantages of embodiments of the present invention will become more readily apparent from the following description, particularly when taken together with the accompanying drawings.

BRIEF DESCRIPTION OF THE DRAWINGS

FIG. 1A is an illustration depicting an automated plating apparatus, in accordance with embodiments of the present invention.

FIG. 1B is an illustration depicting an automated plating apparatus, in accordance with embodiments of the present invention.

FIG. 2A is an illustration depicting X-direction movement, in accordance with embodiments of the present invention.

FIG. 2B is an illustration depicting X-direction movement, in accordance with embodiments of the present invention.

FIG. 3A is an illustration depicting Y-direction movement, in accordance with embodiments of the present invention.

FIG. 3B is an illustration depicting Y-direction movement, in accordance with embodiments of the present invention.

FIG. 4A is an illustration depicting cover displacement by a magnet, in accordance with embodiments of the present invention.

FIG. 4B is an illustration depicting cover displacement by a magnet, in accordance with embodiments of the present invention.

FIG. 5A is an illustration depicting a cover in a closed position in accordance with a first embodiment of the present invention.

FIG. 5B is an illustration depicting a position enabling cover movement, in accordance with the first embodiment of the present invention.

FIG. 5C is an illustration depicting initial cover movement, in accordance with the first embodiment of the present invention.

FIG. 5D is an illustration depicting an uncovered chemical solution, in accordance with the first embodiment of the present invention.

FIG. 5E is an illustration depicting a final cover position, in accordance with the first embodiment of the present invention.

FIG. 6A is an illustration depicting a cover in a closed position, in accordance with second and third embodiments of the present invention.

FIG. 6B is an illustration depicting a position enabling cover movement, in accordance with a second embodiment of the present invention.

FIG. 6C is an illustration depicting initial cover movement, in accordance with the second embodiment of the present invention.

FIG. 6D is an illustration depicting an uncovered chemical solution, in accordance with the second embodiment of the present invention.

FIG. 6E is an illustration depicting a final cover position, in accordance with the second embodiment of the present invention.

FIG. 6F is an illustration depicting a position enabling cover movement, in accordance with a third embodiment of the present invention.

FIG. 6G is an illustration depicting initial cover movement, in accordance with the third embodiment of the present invention.

FIG. 6H is an illustration depicting an uncovered chemical solution, in accordance with the third embodiment of the present invention.

FIG. 6I is an illustration depicting a final cover position, in accordance with the third embodiment of the present invention.

FIG. 7A is an illustration depicting a final cover position, in accordance with the third embodiment of the present invention.

FIG. 7B is an illustration depicting rotating an actuated magnet, in accordance with the third embodiment of the present invention.

FIG. 7C is an illustration depicting cover movement, in accordance with the third embodiment of the present invention.

FIG. 7D is an illustration depicting final cover movement, in accordance with the third embodiment of the present invention.

FIG. 8A is a flowchart illustrating a cover opening process for a spring-loaded cover, in accordance with the first embodiment of the present invention.

FIG. 8B is a flowchart illustrating a cover opening process using attraction force for a free-moving cover, in accordance with the second embodiment of the present invention.

FIG. 8C is a flowchart illustrating a cover opening process using repellant force for a free-moving cover, in accordance with the third embodiment of the present invention.

FIG. 9A is a flowchart illustrating a cover closing process for a free-moving cover, in accordance with the third embodiment of the present invention.

FIG. 9B is a flowchart illustrating a cover closing process using a sensor, in accordance with a fourth embodiment of the present invention.

DETAILED DESCRIPTION

The present invention is directed to methods and systems for limiting chemical solution evaporation in semiconductor processes. Chemical solutions are liquid mixtures of substances used in semiconductor process operations. For example, metallic plating operations to semiconductor die pads may require one or more of electroless nickel, electroless palladium, or immersion gold solutions. Each of these steps are performed separately and independently—typically with a deionized water rinse between each plating step.

Referring now to FIG. 1A, an illustration depicting an automated plating apparatus 100, in accordance with embodiments of the present invention is shown. The automated plating apparatus 100 is used for semiconductor processing operations to provide various chemical processing for semiconductor dice. In some embodiments, the apparatus 100 may be very large and complex in order to process wafers consisting of tens or hundreds of semiconductor dice at the same time. In other embodiments, the apparatus 100 may fit comfortably on a table top in order to process one die to a small number of singular dice at the same time. In general, the apparatus 100 may include a number of different chemical solutions and rinses, with one rinse (commonly deionized water, although other types of rinses apply equally) generally allocated to each chemical solution. Typically, the apparatus 100 is used for various types of semiconductor plating operations, although the present invention is not concerned with plating or any other specific semiconductor operation per se.

The apparatus 100 may include an apparatus base 112, which provides support for the chemical solutions and rinses. Each chemical solution and rinse is retained within an open-top container 152, which is of a material that does not corrode, interact with, or degrade the chemical solutions or rinses. The apparatus 100 also may include support structures to support one or more robotic actuator(s) 116. The support structures may include any number of vertical structures (four vertical members, shown as one at each corner of the apparatus base 112), and any number of horizontal structures to provide additional rigidity and stability.

FIG. 1A illustrates an apparatus 100 embodiment having five chemical solutions 408 (see FIG. 4) and five rinses or rinse solutions 136. Chemical solutions 408 perform the actual processing required by the required chemical process, while the rinse solutions 136 are used between each chemical processing step to prevent contamination between the various chemical solutions 408. In general, one rinse solution 136 is provided for each chemical solution 408. The number of chemical solutions 408 and rinse solutions 136 is determined by the chemical process being used. The present invention is not limited to any number of chemical solutions 408 or rinse solutions 136.

In order to limit evaporation of the chemical solutions 408, a removable cover 140 is provided over each chemical solution 408. The cover 140 is closed (i.e. covering the container 152 holding the chemical solution 408) when the chemical solution 408 is not being used, and is opened when the chemical solution 408 is in-use. Although FIGS. 1A-4B illustrate covers 140 used for the chemical solutions 408 only, in other embodiments the rinse solutions 136 may also have removable covers 140 to limit evaporation. In other embodiments, some chemical solutions 408 and/or rinse solutions 136 may have covers 140, while other chemical solutions 408 and/or rinse solutions 136 may not.

Each covered container 152 may have an associated assembly that may include a cover 140, cover travel rails 144, and one or more cover magnets 148 or first magnets. Cover 140 may be constructed of any rigid material that prevents evaporation of a chemical solution 408 in a container 152. In some embodiments, covers 140 may be constructed of multiple materials bonded together. For example, a top cover section may be made of aluminum and a bottom cover section may be made of a plastic or rubber material bonded to the top section. The cover travel rails 144 allow the cover 140 to slide forward and backward with an acceptable level of static and dynamic friction. Acceptable means that a friction level that may be overcome with repellant and attraction force between an actuated magnet 124 and the cover magnet 148.

The cover travel rails 144 and or cover 140 may also include one or more features to limit forward and backward movement. For example, the cover travel rails 144 may include stops at the back end (left end as shown in FIGS. 5A-7D) to limit rearward movement. The cover magnet 148 may be the same type or a similar magnet as the actuated magnet 124, and in one embodiment may be rigidly attached to a top surface of the cover 140 in proximity to a front edge of the cover 140. In another embodiment, the cover magnet 148 may be included within the cover 140 itself or the cover 140 may also be the cover magnet 148. In one embodiment, the cover magnet 148 may be a top surface of the cover 140, perhaps with a non-metallic plastic or rubber surface as the bottom surface of the cover 140. This may advantageously provide a cover assembly having a lower height, fewer components, and no danger of a cover magnet 148 separating from the top surface of the cover 140.

The apparatus 100 may include one or more robotic actuators 116. The robotic actuator 116 includes one or more actuators (motors, solenoids, magnets, hydraulics, air pressure, etc.) that move the robotic actuator 116 and everything directly coupled to it in response to received commands. In one embodiment, the robotic actuator 116 may include a processor and memory to receive commands and translate the commands into motor or other controls to move the robotic actuator 116. In another embodiment, the robotic actuator 116 may not include the processor and memory, and they may be elsewhere within the apparatus 100.

The robotic actuator 116 travels along an X-direction travel rail 128 and a Y-direction travel rail 132. In the embodiment illustrated, the robotic actuator 116 moves only in the X and Y directions. In other embodiments, the robotic actuator 116 may also move in the Z-direction (i.e. up-down) with appropriate further modifications. The X-direction travel rail 128 provides a path in the X-direction (right-left) that the robotic actuator 116 moves along in order to align with a container 152 or selected set of containers 152 (i.e. a container 152/chemical solution 408 and a container 152/rinse solution 136) or return to a home position along the X-direction travel rail 128. The Y-direction travel rail 132 provides a path in the Y-direction (front-back) that the robotic actuator 116 moves along in order to align with and move a selected cover 140/cover magnet 148. The robotic actuators 116 perform two major functions: to open and close covers 140 over chemical solutions 408, and to submerge and remove semiconductor dice from the chemical solutions 408 when the covers 140 are open. For the sake of clarity and simplicity, robotic actuators 116 associated with submerging and removing semiconductor dice are not shown. In one embodiment, this functionality may be provided by the robotic actuator 116 shown. In another embodiment, the submerging and removing functionality may be provided by a separate robotic actuator 116.

Coupled to the robotic actuator 116 is a rigid member 120, which in the illustrated embodiment may be a length to always coincide with a height of the cover magnet 148 or slightly above the cover magnet 148 and may eliminate the need for Z-direction movement. The rigid member 120 translates actuator 116 movement into actuated 124 or second magnet movement. In another embodiment, the rigid member 120 may have a variable length (such as a telescoping member) in order to require some form of manual or actuated Z-direction movement. At a distal end of the rigid member 120 (i.e. the bottom of the rigid member 120) is the actuated magnet 124, which may be rigidly coupled to the rigid member 120. In one embodiment, the rigid member 120 (and hence the actuated magnet 124) may be rotatable either partially or fully as shown and described in FIGS. 7B, 9A, and 9B.

In one embodiment, the apparatus 100 may include a controller 104 that directly controls one or more motors, solenoids, or other form of actuators 116. As such, controller 104 may not include a processor other computer-related device, and may instead include a series of pushbuttons or other controls that activate the actuator 116 in a specific fashion. For example, in one embodiment, a controller 104 may include five pushbuttons to toggle opening or closing the covers 140 for each of the five containers 152. In that embodiment, commands 102, 103, 108 may include one or more connections from specific controls or pushbuttons. In the first embodiment (also reflected in FIGS. 5A-5E), spring force from one or more springs 156 associated with each cover 140 may return the covers 140 to the closed position automatically when an actuator 116 is directed to return to a home position. In another embodiment, a controller 104 may include ten pushbuttons, with five opening the covers 140 for each of the five containers 152 and the other five closing the covers 140 for each of the five containers 152.

In another embodiment, the apparatus 100 may be computer-controlled equipment, with the controller 104 being a computer providing commands to, and receiving feedback from, one or more robotic actuators 116. In one embodiment, a user may selects command(s) 108 to control specific movements of the robotic actuator 116, for example: "move to X position #2", "Open Lid #5", or "Return to home at current X position". In another embodiment, the user selects a macro command that handles all aspects of opening a given cover 140 and immersing one or more die/dice in a chemical solution 408, or even conducting the entire process for a die etc. For example, the entire process may include moving first to position #1 (far left, for example), opening the cover 140, immersing the die/dice in a chemical solution 408 for a period of time, removing the die/dice from the chemical solution 408, closing the cover, moving to a rinse solution 136, immersing the die/dice in the rinse solution 136 for a period of time, removing the die/dice from the rinse solution 136, moving to position #2, repeating, etc.

Referring now to FIG. 1B, an illustration depicting an automated plating apparatus 150, in accordance with embodiments of the present invention is shown. The automated plating apparatus 150 is used for semiconductor processing operations to provide various chemical processing for semiconductor dice. The embodiment illustrated in FIG. 1B is generally similar to the embodiment illustrated in FIG. 1A, but lacks the springs 156 to move the cover 140 from an open position to a closed position. Therefore, force provided by the actuated magnet 124 both opens the cover 140 and closes the cover 140.

The illustrated embodiment 150 uses one cover travel rail 144 on each side of the cover 140, and the cover 140 is able to freely slide forward and backwards. The cover travel rails 144 may be made from a metal material such as aluminum and include lateral guides to vertically capture the cover 140 within the cover travel rails 144. Such guides may prevent a cover 140 from coming loose and separating from the rails 144 or container 152. The cover travel rails 144 and/or cover 140 may also include one or more stops or features to limit forward and/or backward movement.

Referring now to FIG. 2A, an illustration depicting X-direction movement 200, in accordance with embodiments of the present invention is shown. The controller 104 may send an X-direction movement command 208 to the robotic actuator 116. The X-direction movement command 208 may include a physical distance to move (18" for example), or may specify a position ("position #2", for example) that the robotic actuator 116 translates into a distance to be traveled in the X-direction. In response, the actuated magnet 124 moves in the X-direction (-X as shown in FIG. 2A) to align with a selected cover magnet 204. In some embodiments, the robotic actuator 116/rigid member 120/actuated magnet 124 may start at a home position that is usually but not necessarily at one end or the other of the X-direction travel rail 128. In other embodiments, the robotic actuator 116/rigid member 120/actuated magnet 124 may start at a previous X position that corresponds to a different chemical solution 408 X coordinate.

Referring now to FIG. 2B, an illustration depicting X-direction movement 250, in accordance with embodiments of the present invention is shown. The embodiment illustrated in FIG. 2B uses the features and operation described in FIG. 1B. Therefore, aside from operations associated with springs 156, the operations performed with reference to FIG. 2B are the same as operations described with reference to FIG. 2A.

Referring now to FIG. 3A, an illustration depicting Y-direction movement 300, in accordance with embodiments of the present invention is shown. The controller 104 may send a Y-direction movement command 308 to the robotic actuator 116. The Y-direction movement command 308 may include a physical distance to move (12" for example), or may specify a position ("chemical solution container at position #2", for example) that the robotic actuator 116 translates into a distance to be traveled in the Y-direction. In response, the actuated magnet 124 moves in the Y-direction (+Y as shown in FIG. 3A) to align with a selected cover magnet 304. In some embodiments, the robotic actuator 116/rigid member 120/actuated magnet 124 may start at a home position that is usually but not necessarily at the front end of the Y-direction travel rail 132. In other embodiments, the robotic actuator 116/rigid member 120/actuated magnet 124 may start at a previous Y position that corresponds to a different chemical solution 408 or rinse solution 136 Y coordinate.

Referring now to FIG. 3B, an illustration depicting Y-direction movement 350, in accordance with embodiments of the present invention is shown. The embodiment illustrated in FIG. 3B uses the features and operation described in FIG. 1B. Therefore, aside from operations associated with springs 156, the operations performed with reference to FIG. 3B are the same as operations described with reference to FIG. 3A.

Referring now to FIG. 4A, an illustration depicting cover displacement by a magnet 400, in accordance with embodiments of the present invention is shown. FIG. 4A illustrates the end portion of Y-direction movement corresponding to a Y-direction movement command 308 that opens a cover 140 over a chemical solution 408. The robotic actuator 116 has moved the actuated magnet 124 in proximity to the cover magnet 148. At the point illustrated in FIG. 4A, magnetic force (repellant force) displaces the cover 404 to an extent that the chemical solution 408 is fully uncovered. Although it may appear that the actuated magnet 124 and the rigid member 120 may be physically directly above the chemical solution 408, in real-world embodiments, both would likely not be directly above the chemical solution 408 as that may interfere with other components used to immerse die/dice into the chemical solution(s) 408 and/or rinse solution(s) 136. For example, both magnets 124/408 may be physically located off to the side of a cover 140 in order to not interfere with the other components. At this point, the semiconductor die or dice may be immersed in the chemical solution 408 by other means known in the art. Thus, FIGS. 1A-4A illustrate the approximate steps required to use springs 156 and magnetic repellant force in order to make a chemical solution 408 available for use.

Referring now to FIG. 4B, an illustration depicting cover displacement by a magnet 450, in accordance with embodiments of the present invention is shown. FIG. 4B illustrates the end portion of Y-direction movement corresponding to a Y-direction movement command 308 that opens a cover 140 over a chemical solution 408. The robotic actuator 116 has moved the actuated magnet 124 in proximity to the cover magnet 148. At the point illustrated in FIG. 4B, magnetic force (attraction force) displaces the cover 454 to an extent that the chemical solution 408 is fully uncovered. Although it may appear that the actuated magnet 124 and the rigid member 120 may be physically directly above the chemical solution 408, in real-world embodiments, both would likely not be directly above the chemical solution 408 as that may interfere with other components used to immerse die/dice into the chemical solution(s) 408 and/or rinse solution(s) 136. For example, both magnets 124/408 may be physically located off to the side of a cover 140 in order to not interfere with the other components. At this point, the semiconductor die or dice may be immersed in the chemical solution 408 by other means known in the art. Thus, FIGS. 1B-4B illustrate the approximate steps required to use magnetic attraction force in order to make a chemical solution 408 available for use.

Referring now to FIG. 5A, an illustration depicting a cover in a closed position 500, in accordance with a first embodiment of the present invention is shown. FIGS. 5A-5E illustrates a side view of a cover assembly of a first embodiment, reflecting the apparatus 100, 200, 300, and 400 shown and described with reference to FIGS. 1A, 2A, 3A, and 4A, respectively. The first embodiment utilizes one or more springs 156 that provide a spring force to return the cover 140 to a closed position (as shown in FIG. 5A) after being opened. Thus, FIG. 5A represents the state of the cover 140 when a chemical solution 408 is not being accessed as well as just after when the chemical solution 408 has been accessed and the robotic actuator 116/actuated magnet 124 moves away. In the illustrated embodiment, a spring 156 in an uncompressed state 508 is between a rear portion of the cover 140 and a stop at a back end of a cover travel rail 144. A front end of the cover 140 may rest against a stop 506, which prevents further cover 140 movement forward (i.e. to the right). The type of stop 506 is only illustrative for clarity purposes, and many other forms of stops 506 may be used without deviating from the present application. In other embodiments, a different spring 156 arrangement may be utilized that generates spring force from one or more springs 156 in expansion. In one embodiment, each cover travel rail 144 may be uniquely associated with a spring 156. In other embodiments, there may be no direct association between cover travel rails 144 and springs 156. For example, one or more springs 156 may be included within the cover 140 itself, rather than associated with the cover travel rails 144. The cover magnet 148 may have a fixed polarity 504. Permanent magnets 148 have a south pole and an opposite north pole. In one embodiment, the north pole faces toward the front of the apparatus 500 (i.e. to the right of FIG. 5A). In another embodiment, the south pole faces toward the front of the apparatus 500 (not shown). In yet another embodiment, the cover magnet polarity 504 may be at a different angle than shown, including but not limited to, an up-down north or south polarity 504.

Referring now to FIG. 5B, an illustration depicting a position enabling cover movement 510, in accordance with the first embodiment of the present invention is shown. In FIG. 5B, the robotic actuator 116 is executing a Y-direction movement command 308, and is approaching a selected cover 140 and chemical solution 408. The actuated magnet 124 has an opposite polarity 504 to the cover magnet 148, such that common poles face each other. This generates a repellant force of increasing strength as the magnets 124, 148 move closer together. At a point, the separation distance D 512 is achieved, which produces enough repellant force to exceed the combined spring 156 force and friction force between the cover 140 and cover rails 144. Thus, at this point the cover 140 will move rearward (i.e. to the left in FIG. 5B) at the same speed as the robotic actuator 116.

Referring now to FIG. 5C, an illustration depicting initial cover movement 520, in accordance with the first embodiment of the present invention is shown. FIG. 5C illustrates the cover 140 opening, with approximately half of the container 152 and chemical solution 408 exposed. The robotic actuator moves the actuated magnet toward the cover 524A, which in turn causes the magnetic force to move the cover 528A rearward while compressing the spring 532A. The repellant force is sufficient to overcome the compressed spring 532A force and continue to move the cover 140. At this point, the distance specified by the Y-distance movement command 308 has not been reached.

Referring now to FIG. 5D, an illustration depicting an uncovered chemical solution 540, in accordance with the first embodiment of the present invention is shown. FIG. 5D continues the cover 140 opening process from FIG. 5C, but at this point the cover 140 is fully open with respect to the container 152 and the chemical solution 408. The robotic actuator moves the actuated magnet toward the cover 524B, which in turn causes the magnetic force to move the cover 528B rearward while compressing the spring 532B. The repellant force is sufficient to overcome the compressed spring 532B force and continue to move the cover 140. At this point, the distance specified by the Y-distance movement command 308 has still not been reached, although in some embodiments the Y-distance may correspond to the cover 140 position shown.

Referring now to FIG. 5E, an illustration depicting a final cover position 550, in accordance with the first embodiment of the present invention is shown. FIG. 5E illustrates a final cover 140 position, where the Y-distance specified in the Y-distance movement command 308 has been reached and the cover 140 is clear of the container 152 and the chemical solution 408. The spring is in a compressed state 554, although not fully compressed in order to avoid over-compression and spring deformation. At this point, a robotic actuator 116 (either the robotic actuator 116 shown or a different robotic actuator) immerses and submerges one or more semiconductor die/dice into the chemical solution 408, in order to perform a step of a larger semiconductor process. It should be noted that following processing using the chemical solution 408, the cover 140 automatically closes when the robotic actuator 116 moves away. This is because there is no longer a repellant force present between the magnets 124, 148 to oppose the spring 156 force, and the spring(s) 156 push the cover 140 back to a closed position. Thus, an advantage of the first embodiment is there is not a need for an "active" cover 140 closing process such as in FIGS. 7A-7D. The second embodiment of FIGS. 6A-6E and third embodiment of FIGS. 6F-6I, where no springs 156 are used, requires such an active process to close the cover 140. FIGS. 5A-5E illustrates the actuated magnet 124 vertically coincident with the cover magnet 148. It should be observed that a vertical magnet separation 512 as shown in FIGS. 6B-6E may alternately be used without deviating from the operations shown and described in FIGS. 5A-5E.

Referring now to FIG. 6A, an illustration depicting a cover in a closed position 600, in accordance with second and third embodiments of the present invention is shown. FIGS. 6A-6E illustrates a side view of a cover assembly of a second embodiment. The second embodiment uses no springs 156. This reduces the force required to open the cover 140 because in the second and third embodiments only friction between the cover 140 and the cover rails 144 must be overcome. FIG. 6A represents the state of the cover 140 when a chemical solution 408 is not being accessed as well as just after when the chemical solution 408 has been accessed and the robotic actuator 116/actuated magnet 124 moves away (to the right in FIG. 6A). A front end of the cover 140 may rest against a stop 506, which prevents further cover 140 movement forward (i.e. to the right). The type of stop 506 is only illustrative for clarity purposes, and many other forms of stops 506 may be used without deviating from the present application. The cover magnet 148 may have a fixed polarity 504. Permanent magnets 148 have a south pole and an opposite north pole. In one embodiment, the north pole faces toward the front of the apparatus 600 (i.e. to the right of FIG. 6A). In another embodiment, the south pole faces toward the front of the apparatus 600 (not shown). FIGS. 6A-6I show the cover travel rail 144 configuration previously shown in FIGS. 1A, 2A, 3A, and 4A for ease and clarity of illustration. That is, low-profile cover travel rails 144 without springs 156. It should be understood that many other embodiments and configurations may be used without deviating from the invention as described, and those alternatives should be considered as covered by the described and claimed embodiments herein.

Referring now to FIG. 6B, an illustration depicting a position enabling cover movement 610, in accordance with a second embodiment of the present invention is shown. In FIG. 6B, the robotic actuator 116 is executing a Y-direction movement command 308, and is approaching a selected cover 140 and chemical solution 408. The actuated magnet 124 has a same polarity 504 as the cover magnet 148, such that common poles face the same direction (i.e. both north poles or both south poles to the right). This generates an attraction force of increasing strength as the magnets 124, 148 move closer together. At a point, the separation distance D 512 is achieved, which produces enough attraction force to exceed the friction force between the cover 140 and cover rails 144. Thus, at this point the cover 140 will move rearward (i.e. to the left in FIG. 6B) at the same speed as the robotic actuator 116. FIGS. 6B-6E illustrates the actuated magnet 124 physically located above the cover magnet 148. This has the advantage of preventing physical contact between the actuated magnet 124 and the cover magnet 148 since the cover 140/cover magnet 148 is vertically secured by the cover travel rails 144 and there is no Z-direction movement (i.e. up-down) enabled by the robotic actuator 116.

Referring now to FIG. 6C, an illustration depicting initial cover movement 620, in accordance with the second embodiment of the present invention is shown. FIG. 6C illustrates the cover 140 opening, with approximately half of the container 152 and chemical solution 408 exposed. An attraction force 624 between the actuated magnet 124 and the cover magnet 148 provides sufficient force to move the cover 140 when the robotic actuator 116/actuated magnet 124 moves. The robotic actuator moves the actuated magnet toward the cover 524A, which in turn causes the magnetic force to move the cover 528A rearward. The attraction force is sufficient to overcome the friction force and continue to move the cover 140. At this point, the distance specified by the Y-distance movement command 308 has not been reached.

Referring now to FIG. 6D, an illustration depicting an uncovered chemical solution 630, in accordance with the second embodiment of the present invention is shown. FIG. 6D continues the cover 140 opening process from FIG. 6C, but at this point the cover 140 is fully open with respect to the container 152 and the chemical solution 408. The attraction force 624 between the actuated magnet 124 and the cover magnet 148 continues to provide sufficient force to move the cover 140 when the robotic actuator 116/actuated magnet 124 moves. The robotic actuator moves the actuated magnet toward the cover 524B, which in turn causes the magnetic force to move the cover 528B rearward. The attraction force is sufficient to overcome the friction force and continue to move the cover 140. At this point, the distance specified by the Y-distance movement command 308 has still not been reached, although in some embodiments the Y-distance may correspond to the cover position shown.

Referring now to FIG. 6E, an illustration depicting a final cover position 640, in accordance with the second embodiment of the present invention is shown. FIG. 6E illustrates a final cover position, where the Y-distance specified in the Y-distance movement command 308 has been reached and the cover 140 is clear of the container 152 and the chemical solution 408. At this point, a robotic actuator 116 (either the robotic actuator 116 shown or a different robotic actuator) immerses and submerges one or more semiconductor dice into the chemical solution 408, in order to perform a step of a larger semiconductor process. It should be noted that following processing using the chemical solution 408, the cover 140 does automatically close when the robotic actuator 116 moves away, even though there are no return spring(s) 156 present. This is because the second embodiment (FIGS. 6A-6E) uses magnetic attraction force between the actuated magnet 124 and the cover magnet 148 at all times. Therefore, when the robotic actuator 116 moves to a home position (to the right in FIG. 6E), the attraction force causes the actuated magnet 124 to pull the cover magnet 148/cover 140 along until a mechanical stop 506 is reached—thus leaving the cover 140 in a closed position over the container 152 and chemical solution 408. The robotic actuator 116 and actuated magnet 124 continue to move to a home position or different position, out of attraction range with the cover magnet 148. The second embodiment is therefore the preferred embodiment of the present invention since it does not require springs 156, a rotatable rigid member 658, or a sensor 654 and associated control software. This advantageously reduces cost and complexity compared to other embodiments.

Referring now to FIG. 6F, an illustration depicting a position enabling cover movement 610, in accordance with a third embodiment of the present invention is shown. FIGS. 6A and 6F-6I show and describe a third embodiment of the present invention. FIG. 6F immediately follows the state described in FIG. 6A. In FIG. 6F, the robotic actuator 116 is executing a Y-direction movement command 308, and is approaching a selected cover 140 and chemical solution 408. The actuated magnet 124 has an opposite polarity 504 to the cover magnet 148, such that common poles face each other (i.e. either north to north or south to south). This generates a repellant force of increasing strength as the magnets 124, 148 move closer together. At a point, the separation distance D 512 is achieved, which produces enough repellant force to exceed the friction force between the cover 140 and cover rails 144. Thus, at this point the cover 140 will move rearward (i.e. to the left in FIG. 6F) at the same speed as the robotic actuator 116. FIGS. 6F-6I illustrates the actuated magnet 124 vertically coincident with the cover magnet 148. It should be observed that a vertical magnet separation 512 as shown in FIGS. 6B-6E may alternately be used without deviating from the operations shown and described in FIGS. 6F-6I.

Associated with the robotic actuator 116 is a sensor 654, which provides data to measure the separation distance D 512 between the actuated magnet 124 and the cover magnet 148. The sensor 654 may be a camera, an optical sensor, a magnetic sensor, or any other type of sensor 654 suitable for measuring the distance 512 in real time. In one embodiment, the sensor 654 may continuously measure the separation distance 512 during cover 140 opening operations in order to maintain a separation distance D. The sensor 654 may provide measurement data to a computer such as controller 104 as feedback 108, and the controller 104 may provide Y-direction movement commands 308 to accelerate or decelerate the robotic actuator 116 as required to maintain a predetermined separation distance. For example, if the separation distance 512 is less than a predetermined separation distance D, a Y-direction movement command 308 may be issued to the robotic actuator 116 to slow down the robotic actuator 116 by some amount. If the separation distance 512 is more than D, a Y-direction movement command 308 may be issued to the robotic actuator 116 to speed up the robotic actuator 116 to return to the separation distance D These adjustments may continue until the state reflected in FIG. 6I.

Referring now to FIG. 6G, an illustration depicting initial cover movement 660, in accordance with the third embodiment of the present invention is shown. FIG. 6G illustrates the cover 140 opening, with approximately half of the container 152 and chemical solution 408 exposed. A repellant force 664 between the actuated magnet 124 and the cover magnet 148 continues to provide sufficient force to move the cover 140 when the robotic actuator 116/actuated magnet 124 moves. The robotic actuator moves the actuated magnet toward the cover 524A, which in turn causes the magnetic force to move the cover 528A rearward. The repellant force is sufficient to overcome the friction force and continue to move the cover 140. At this point, the distance specified by the Y-distance movement command 308 has not been reached.

In some embodiments, the sensor 654, robotic actuator 116, and controller 104 may modulate the repellant force between the actuated magnet 124 and the cover magnet 148 in order to control the separation distance 512 as shown in FIGS. 6G-6I. This is described in more detail with respect to FIG. 7B, where the axis of the actuated magnet 124 may be rotated by the rigid rotatable member 658 in order to not be directly coincident with the cover magnet 148. This may reduce the repellant force and thereby allow the separation distance 512 to be controlled.

Referring now to FIG. 6H, an illustration depicting an uncovered chemical solution 670, in accordance with the third embodiment of the present invention is shown. FIG. 6H continues the cover 140 opening process from FIG. 6G, but at this point the cover 140 is fully open with respect to the container 152 and the chemical solution 408. The repellant force 664 between the actuated magnet 124 and the cover magnet 148 continues to provide sufficient force to move the cover 140 when the robotic actuator 116/actuated magnet 124 moves. The robotic actuator moves the actuated magnet toward the cover 524B, which in turn causes the magnetic force to move the cover 528B rearward. The repellant force is sufficient to overcome the friction force and continue to move the cover 140. At this point, the distance specified by the Y-distance movement command 308 has still not been reached, although in some embodiments the Y-distance may correspond to the cover position shown.

Referring now to FIG. 6I, an illustration depicting a final cover position 680, in accordance with the third embodiment of the present invention is shown. FIG. 6I illustrates a final cover position, where the Y-distance specified in the Y-distance movement command 308 has been reached and the cover 140 is clear of the container 152 and the chemical solution 408. At this point, a robotic actuator 116 (either the robotic actuator 116 shown or a different robotic actuator) immerses and submerges one or more semiconductor dice into the chemical solution 408, in order to perform a step of a larger semiconductor process. It should be noted that following processing using the chemical solution 408, the cover 140 does not automatically close when the robotic actuator 116 moves away. This is because the actuated magnet 124 and the cover magnet 148 are still configured to provide repellant force and there is no spring 156 force to return the cover 140 to a closed position. FIGS. 7A-7D remedy that limitation.

Referring now to FIG. 7A, an illustration depicting a final cover position 700, in accordance with the third embodiment of the present invention is shown. FIGS. 7A-7D illustrates a third embodiment of the present invention, where springs 156 are not used to return the cover 140 to a closed position after being in an open position. As such, FIGS. 7A-7D do not apply to FIGS. 5A-5E where springs are utilized or FIGS. 6B-6E where only magnetic attraction force is used. FIG. 7A is similar to, and follows, the state shown in FIG. 6I, where the robotic actuator 116 is at the Y-distance position, the cover 140 is fully back, and the magnets 124, 148 are configured to provide repellant force. At this point, the rigid rotatable member 658 is in the same state as FIGS. 6F-6I.

Associated with the robotic actuator 116 is a sensor 654, which provides data to measure the separation distance D 512 between the actuated magnet 124 and the cover magnet 148. The sensor 654 may be part of the robotic actuator 116 or separate from the robotic actuator 116 and a camera, an optical sensor, a magnetic sensor, or any other type of sensor 654 suitable for measuring the distance 512 in real time. In one embodiment, the sensor 654 may continuously measure the separation distance 512 during cover 140 opening operations in order to maintain a separation distance D. The sensor 654 may provide measurement data to a computer such as controller 104 as feedback 108, and the controller 104 may provide Y-direction movement commands 308 to accelerate or decelerate the robotic actuator 116 as required to maintain the separation 512. For example, if the separation distance 512 is less than D, a Y-direction movement command 308 may be issued to the robotic actuator 116 to slow down the robotic actuator 116 by some amount. If the separation distance 512 is more than D, a Y-direction movement command 308 may be issued to the robotic actuator 116 to speed up the robotic actuator 116 to return to the separation distance D These adjustments may continue until the state reflected in FIG. 7D. In another embodiment, if the separation distance 512 is less than D, a Y-direction movement command 308 may be issued to the robotic actuator 116 to rotate the actuated magnet 124 relative to the cover magnet 148 in order to reduce attraction force and thereby slow down the robotic actuator 116 by some amount. If the separation distance 512 is more than D, a Y-direction movement command 308 may be issued to the robotic actuator 116 to rotate the actuated magnet 124 relative to the cover magnet 148 in order to increase attraction force and thereby speed up the robotic actuator 116 to return to the separation distance D Referring now to FIG. 7B, an illustration depicting rotating an actuated magnet 710, in accordance with the third embodiment of the present invention is shown. At FIG. 7B, the robotic actuator 116 has received a Y-direction movement command 308 to move the robotic actuator 116 toward the front of the apparatus 100, in preparation for an X-direction movement to follow. The robotic actuator 116 does not initiate a movement in the Y-direction yet, but first rotates the rigid member 714 to reverse the polarity of the actuated magnet 718. This rotation 714 configures the actuated magnet 124 to provide an attraction force with the cover magnet 148. Assuming the cover magnet 148 is polarized as shown in FIG. 7B, with the north pole facing forward (i.e. to the right in FIG. 7B), the rigid member 658 is rotated in order for the actuated magnet 124 polarity to have its south pole facing the north pole of the cover magnet 148. Assuming the cover magnet 148 is polarized opposite as shown in FIG. 7B, with the south pole facing forward (i.e. to the right in FIG. 7B), the rigid member 658 is rotated in order for the actuated magnet 124 polarity to have its north pole facing the south pole of the cover magnet 148. This produces an attraction force between the first magnet (cover magnet 148) and the second magnet (actuated magnet 124). In one embodiment, the attraction force causes the cover magnet 148/cover 140 to move toward the actuated magnet 124. It may be undesirable for the cover magnet 148 to physically and directly contact the actuated magnet 124 since that may potentially produce a spark from static electricity or other known means. Therefore, in order to prevent direct contact, the robotic actuator 116 may begin moving away (i.e., to the right in FIG. 7B) immediately after rotating 714 the actuated magnet 124. In another embodiment, the robotic actuator 116 may begin moving away (i.e., to the right in FIG. 7B) a time period after rotating 714 the actuated magnet 124. Once the attraction force has been provided, the cover 140 must first overcome static friction force with the cover travel rails 144 in order to begin moving.

Attraction and repellant force is maximized when the axis of the cover magnet 148 exactly coincides with the axis of the actuated magnet 124, since the magnetic fields add as much as possible when the axes are coincident. In some embodiments, maximizing attraction or repellant force may be desirable, and the robotic actuator 116 may rotate 714 the rigid rotatable member 658 and actuated magnet 124 180 degrees (e.g. opposite to whatever actual direction the actuated magnet 124 was previously facing). However, in other embodiments it may be desirable to have a fractional attraction or repellant force instead. For example, in FIG. 7B it may be desirable to rotate 714 the rigid member 658 from full repellant force to fractional attraction force in order to slowly move the cover magnet 148/cover 140 toward the actuated magnet 124 and prevent contact. This slow movement may provide sufficient time for the sensor 654 to observe the cover magnet 148/cover 140 movement reducing the separation distance 512, the controller 104 receiving such feedback 108, and the controller 104 issuing an adjusted or modified Y-direction movement command 308. The modified or adjusted Y-direction movement command 308 may, for example, accelerate the robotic actuator 116 in order to stay ahead of the cover magnet 148/cover 140 and maintain a separation distance 512 in order to prevent contact as previously described. Therefore, in some embodiments the robotic actuator 116 may rotate 714 the actuated magnet 124 in multiple angular increments in order to accelerate or decelerate movement of the cover magnet 148/cover 140 relative to the actuated magnet 124. This may require one or more commands from the controller 104.

In most embodiments, the robotic actuator 116, having received the initial Y-direction movement command, starts executing the command and moving (to the right in FIG. 7B) as soon as the sensor 654 detects movement by the cover magnet 148/cover 140 and the separation distance 512 decreasing. In one embodiment, this may occur while the rigid member 658 is rotating 714. In another embodiment, this may occur after the rigid member 658 has completed rotation 714.

Referring now to FIG. 7C, an illustration depicting cover movement 720, in accordance with the third embodiment of the present invention is shown. FIG. 7C illustrates the cover 140 closing, with approximately half of the container 152 and chemical solution 408 still exposed. The robotic actuator moves the actuated magnet away from the cover 724A, which in turn causes the magnetic force to move the cover 728A frontward. The attraction force is sufficient to overcome the friction force and continue to move the cover 140. At this point, the distance specified by the Y-distance movement command 308 has not been reached.

In some embodiments, the sensor 654, robotic actuator 116, and controller 104 may modulate the repellant force between the actuated magnet 124 and the cover magnet 148 in order to control the separation distance 512 as shown in FIGS. 6F-6H. The axis of the actuated magnet 124 may be rotated by the rigid rotatable member 658 in order to not be directly coincident with the cover magnet 148. This may reduce the attraction force and thereby allow the separation distance 512 to be controlled. Because the cover magnet 148/cover 140 movement is limited by friction, and dynamic friction (i.e. when moving) is less than static friction (i.e. when stopped), in some embodiments coordinated movement between the actuated magnet 124 and the cover magnet 148 may be easier to control when the attraction force is somewhat lower. Therefore, modulating the attraction force by rotating the rigid rotatable member 658 while moving may provide a useful way to prevent contact between the magnets 124, 148 while maintaining an effective separation distance 512.

Referring now to FIG. 7D, an illustration depicting final cover movement 730, in accordance with the third embodiment of the present invention is shown. In FIG. 7D, the robotic actuator 116 is executing a Y-direction movement command 308, and is moving away from a selected cover 140 and chemical solution 408. A front end of the cover 140 may rest against a stop 506, which prevents further cover 140 movement forward (i.e. to the right). The type of stop 506 is only illustrative for clarity purposes, and many other forms of stops 506 may be used without deviating from the present application. The actuated magnet 124 has a same polarity 504 as the cover magnet 148, such that common poles face in the same direction. This provides an attraction force of decreasing strength as the magnets 124, 148 move farther apart. When the cover 140 reaches a forward stop 506, the cover 140 stops while the robotic actuator 116/actuated magnet 124 keeps moving forward (i.e. to the right). Thus, at this point the robotic actuator 116 continues moving until the Y-distance is reached.

Referring now to FIG. 8A, a flowchart illustrating a cover opening process for a spring-loaded cover 800, in accordance with the first embodiment of the present invention is shown. Where a spring-loaded cover 140 is used, the cover 140 is generally in a closed disposition, and may be opened using the process illustrated in FIG. 8A, or an alternative. Flow begins at block 804.

At block 804, a robotic actuator 116 receives an X-direction movement command 208 from a controller 104. The X-direction movement command 208 controls left and right movement by the robotic actuator 116. In one embodiment, the X-direction movement command 208 specifies a direction and a distance. In another embodiment, the X-direction movement command 208 specifies a distance only, and the type of command (X direction movement command 208) inherently specifies the direction. Flow proceeds to block 808.

At block 808, the robotic actuator 116 moves a distance that corresponds to the X direction movement command 208. This horizontally positions the actuated magnet 124 directly in front of a cover 140 and cover magnet 148 for a selected chemical solution 408. Flow proceeds to block 812.

At block 812, the robotic actuator 116 receives a Y-direction movement command 308 from the controller 104. The Y-direction movement command 308 controls front and back movement by the robotic actuator 116. In one embodiment, the Y-direction movement command 308 specifies a direction and a distance. In another embodiment, the Y-direction movement command 308 specifies a distance only, and the type of command (Y direction movement command 308) inherently specifies the direction. Flow proceeds to block 816.

At block 816, the robotic actuator 116 moves according to the Y-direction movement command 308. The Y-direction movement command 308 directs the robotic actuator 116 to move from a home position near the front most X-direction travel rail 128 to over the cover 140. Flow proceeds to block 820.

At block 820, an actuated magnet 124 rigidly coupled to the robotic actuator 116 exerts a repellant force on the cover magnet 148. In some embodiments, the cover 140 rests against a stop 506, that prevents further forward cover 140 movement but does not hinder rearward cover 140 movement. The amount of repellant force is a function of magnet strength of both magnets 124, 148, orientation between the magnets 124, 148, and a distance between the magnets 124, 148. In order to move the cover 140 without the magnets 124, 148 touching, the repellant force must be greater than the spring force of the spring 508 and any associated friction between the cover 140 and the cover travel rails 144. Flow proceeds to block 824.

At block 824, the cover 140 moves rearward due to the repellant force and the speed of robotic actuator 116 movement. As the cover 140 moves rearward, a container 152 for the chemical solution 408 is exposed for access. Flow proceeds to decision block 828.

At decision block 828, a determination is made if the Y distance (i.e. the distance specified by the Y-direction movement command 308) has been reached. The Y distance corresponds to a position of the robotic actuator 116 (and hence actuated magnet 124 and cover 140) that fully uncovers the chemical solution container 152. In one embodiment, the cover 140 may only move far enough to allow complete unhindered access to the container 152. In another embodiment, the cover 140 may move further back along the cover travel rails 144 in order to provide additional clearance from the container 152 and the chemical solution 408. If the Y distance has been reached, then flow ends at decision block 828. If the Y distance has not been reached, then flow instead proceeds to block 820 to continue cover 140 movement.

Referring now to FIG. 8B, a flowchart illustrating a cover opening process using attraction force for a free-moving cover 840, in accordance with the second embodiment of the present invention is shown. Flow begins at block 844.

At block 844, a robotic actuator 116 receives an X-direction movement command 208 from a controller 104. The X-direction movement command 208 controls left and right movement by the robotic actuator 116. In one embodiment, the X-direction movement command 208 specifies a direction and a distance. In another embodiment, the X-direction movement command 208 specifies a distance only, and the type of command (X direction movement command 208) inherently specifies the direction. Flow proceeds to block 848.

At block 848, the robotic actuator 116 moves a distance that corresponds to the X direction movement command 208. This horizontally positions the actuated magnet 124 in proximity to a cover 140 and cover magnet 148 for a selected chemical solution 408. Flow proceeds to block 852.

At block 852, the robotic actuator 116 receives a Y-direction movement command 308 from the controller 104. The Y-direction movement command 308 controls front and back movement by the robotic actuator 116. In one embodiment, the Y-direction movement command 308 specifies a direction and a distance. In another embodiment, the Y-direction movement command 308 specifies a distance only, and the type of command (Y direction movement command 308) inherently specifies the direction. Flow proceeds to block 856.

At block 856, the robotic actuator 116 moves according to the Y-direction movement command 308. The Y-direction movement command 308 directs the robotic actuator 116 to move from a home position near the front most X-direction travel rail 128 to over the cover 140. Flow proceeds to block 860.

At block 860, an actuated magnet 124 rigidly coupled to the robotic actuator 116 exerts an attraction force on the cover magnet 148. In some embodiments, the cover 140 rests against a stop 506, that prevents further forward cover 140 movement but does not hinder rearward cover 140 movement. The amount of attraction force is a function of magnet strength of both magnets 124, 148 and a distance between the magnets 124, 148. In order to move the cover 140 without the magnets 124, 148 touching, the attraction force must be greater than friction force between the cover 140 and the cover travel rails 144. Flow proceeds to block 864.

At block 864, the cover 140 moves rearward due to the attraction force and the speed of robotic actuator 116 movement. As the cover 140 moves rearward, a container 152 for the chemical solution 408 is exposed for access. Flow proceeds to decision block 868.

At decision block 868, a determination is made if the Y distance (i.e. the distance specified by the Y-direction movement command 308) has been reached. The Y distance corresponds to a position of the robotic actuator 116 (and hence actuated magnet 124 and cover 140) that fully uncovers the chemical solution container 152. In one embodiment, the cover 140 may only move far enough to allow complete unhindered access to the container 152. In another embodiment, the cover 140 may move further back along the cover travel rails 144 in order to provide additional clearance from the chemical solution 408 and container 152. If the Y distance has been reached, then flow ends at decision block 868. If the Y distance has not been reached, then flow instead proceeds to block 860 to continue cover 140 movement.

Referring now to FIG. 8C, a flowchart illustrating a cover opening process using repellant force for a free-moving cover 880, in accordance with the third embodiment of the present invention is shown. Flow begins at block 882.

At block 882, a robotic actuator 116 receives an X-direction movement command 208 from a controller 104. The X-direction movement command 208 controls left and right movement by the robotic actuator 116. In one embodiment, the X-direction movement command 208 specifies a direction and a distance. In another embodiment, the X-direction movement command 208 specifies a distance only, and the type of command (X-direction movement command 208) inherently specifies the direction. Flow proceeds to block 884.

At block 884, the robotic actuator 116 moves a distance that corresponds to the X-direction movement command 208. This horizontally positions the actuated magnet 124 in proximity to a cover 140 and cover magnet 148 for a selected chemical solution 408. Flow proceeds to block 886.

At block 886, the robotic actuator 116 receives a Y-direction movement command 308 from the controller 104. The Y-direction movement command 308 controls front and back movement by the robotic actuator 116. In one embodiment, the Y-direction movement command 308 specifies a direction and a distance. In another embodiment, the Y-direction movement command 308 specifies a distance only, and the type of command (Y direction movement command 308) inherently specifies the direction. Flow proceeds to block 888.

At block 888, the robotic actuator 116 rotates the rigid rotatable member 658 to configure the repellant force. The rigid rotatable member 658 couples the actuated magnet 124 to the robotic actuator 116, such that robotic actuator 116 movement is translated to the actuated magnet 124. In one embodiment, the rigid rotatable member 658 may be rotated 714 by the robotic actuator 116 in one or more directions. A robotic actuator command 108 may specify one or more of which direction to rotate (i.e. either clockwise or counter-clockwise), to rotate 180 degrees, or to rotate a number of degrees specified within the robotic actuator command 108.

Rotating the rigid rotatable member 658 modifies the attraction or repellant force between the actuated magnet 124 and the cover magnet 148. For example, assuming the magnetic polarities 504 between the magnets 124, 148 are opposing (and thus configured to repel), rotating the rigid rotatable member 658 180 degrees causes the magnetic polarities 504 to become coincidental (and thus configured to attract). Attraction force is maximized when the magnetic polarity 504 of the magnets 124, 148 facing each other are opposites and aligned on a common axis through the center of both magnets 124, 148. Repellant force is maximized when the magnetic polarity 504 of the magnets 124, 148 facing each other are the same and aligned on the common axis through the center of both magnets 124, 148.

Because the repellant force depends on angular displacement between the magnets 124, 148, configuring the repellant force may include rotating the rigid rotatable member 658 a number of degrees to produce the desired repellant force. In some embodiments, this may be less than 180 degrees, between 90 and 180 degrees, or between 180 and 270 degrees. It may be desirable to configure the degree of repellant force in order to configure a movement speed of the cover 140 with respect to the embodiment illustrated and described in FIGS. 6F-6I. For example, depending on friction between the cover 140 and the cover travel rails 144, the smoothest "pushing" movement imparted to the cover 140 may result from a certain degree of rigid rotatable member 658 rotation. Flow proceeds to block 890.

At block 890, the robotic actuator 116 moves according to the Y-direction movement command 308. The Y-direction movement command 308 directs the robotic actuator 116 to move from a home position near the front most X-direction travel rail 128 to over the cover 140. Flow proceeds to block 892.

At block 892, an actuated magnet 124 rigidly coupled to the robotic actuator 116 exerts a repellant force on the cover magnet 148. In some embodiments, the cover 140 rests against a stop 506, that prevents further forward cover 140 movement but does not hinder rearward cover 140 movement. The amount of repellant force is a function of magnet strength of both magnets 124, 148, orientation between the magnets 124, 148, and a distance between the magnets 124, 148. In order to move the cover 140 without the magnets 124, 148 touching, the repellant force must be greater than friction force between the cover 140 and the cover travel rails 144. Flow proceeds to block 894.

At block 894, the cover 140 moves rearward due to the repellant force and the speed of robotic actuator 116 movement. As the cover 140 moves rearward, a container 152 for the chemical solution 408 is exposed for access. Flow proceeds to decision block 896.

At decision block 896, a determination is made if the Y distance (i.e. the distance specified by the Y-direction movement command 308) has been reached. The Y distance corresponds to a position of the robotic actuator 116 (and hence actuated magnet 124 and cover 140) that fully uncovers the chemical solution container 152. In one embodiment, the cover 140 may only move far enough to allow complete unhindered access to the container 152. In another embodiment, the cover 140 may move further back along the cover travel rails 144 in order to provide additional clearance from the chemical solution 408 and container 152. If the Y distance has been reached, then flow ends at decision block 896. If the Y distance has not been reached, then flow instead proceeds to block 892 to continue cover 140 movement.

Referring now to FIG. 9A, a flowchart illustrating a cover closing process for a free-moving cover 900, in accordance with the third embodiment of the present invention is shown. Flow begins at block 904.

At block 904, the robotic actuator 116 receives a Y-direction movement command 308 from the controller 104. The Y-direction movement command 308 controls front and back movement by the robotic actuator 116. In one embodiment, the Y-direction movement command 308 specifies a direction and a distance. In another embodiment, the Y-direction movement command 308 specifies a distance only, and the type of command (Y direction movement command 308) inherently specifies the direction. In yet another embodiment, the Y-direction movement command 308 is a "return to home position" command that instructs the robotic actuator 116 to return to a Y-direction home position (i.e. near the front of the apparatus base 112 below the front most X-direction travel rail 128). Flow proceeds to block 908.

At block 908, the robotic actuator 116 rotates the rigid rotatable member 658 to configure the attraction force. The rigid rotatable member 658 couples the actuated magnet 124 to the robotic actuator 116, such that robotic actuator 116 movement is translated to the actuated magnet 124. In one embodiment, the rigid rotatable member 658 may be rotated 714 by the robotic actuator 116 in one or more directions. A robotic actuator command 108 may specify one or more of which direction to rotate (i.e. either clockwise or counter-clockwise), to rotate 180 degrees, or to rotate a number of degrees specified within a robotic actuator command 108.

Rotating the rigid rotatable member 658 modifies the attraction or repellant force between the actuated magnet 124 and the cover magnet 148. For example, assuming the magnetic polarities 504 between the magnets 124, 148 are opposing (and thus configured to repel), rotating the rigid member 120 180 degrees causes the magnetic polarities 504 to become coincidental (and thus configured to attract). Attraction force is maximized when the magnetic polarity 504 of the magnets 124, 148 facing each other are opposites and aligned on a common axis through the center of both magnets 124, 148. Repellant force is maximized when the magnetic polarity 504 of the magnets 124, 148 facing each other are the same and aligned on the common axis through the center of both magnets 124, 148.

Because the attraction force depends on angular displacement between the magnets 124, 148, configuring the attraction force may include rotating 714 the rigid rotatable member 658 a number of degrees to produce the desired attraction force. In some embodiments, this may be less than 180 degrees, between 90 and 180 degrees, or between 180 and 270 degrees. It may be desirable to configure the degree of attraction force in order to configure a movement speed of the cover 140 with respect to the embodiment illustrated and described in FIGS. 7A-7D. For example, depending on friction between the cover 140 and the cover travel rails 144, the smoothest "pulling" movement imparted to the cover 140 may result from a certain degree of rigid rotatable member 658 rotation. Flow proceeds to block 912.

At block 912, an actuated magnet 124 rigidly coupled to the robotic actuator 116 exerts an attraction force on the cover magnet 148. The amount of attraction force is a function of magnet strength of both magnets 124, 148, orientation between the magnets 124, 148, and a distance between the magnets 124, 148. In order to move the cover 140 without the magnets 124, 148 touching, the attraction force must be greater than friction force between the cover 140 and the cover travel rails 144 and the speed of the robotic actuator 116 and actuated magnet 124 must match the speed of the cover 140 and cover magnet 148. Flow proceeds to block 916.

At block 916, the robotic actuator 116 moves according to the Y-direction movement command 308. The Y-direction movement command 308 directs the robotic actuator 116 to move from over the cover 140 toward a home position near the front most X direction travel rail 128. Flow proceeds to block 920.

At block 920, the cover 140 moves forward due to the attraction force and the speed of robotic actuator 116 movement. As the cover 140 moves forward, the container 152 for the chemical solution 408 is closed for access. Flow proceeds to decision block 924.

At decision block 924, a determination is made if the Y distance (i.e. the distance specified by the Y-direction movement command 308) has been reached. The Y distance corresponds to a position of the robotic actuator 116 (and hence actuated magnet 124 and cover 140) that fully covers the chemical solution 408 container, and a front edge of the cover 140 may rest against a stop 506, as previously discussed. If the Y distance has been reached (robotic actuator 116 returns to the home position), then flow proceeds to block 928. If the Y distance has not been reached, then flow instead proceeds to block 916 to continue cover 140 movement.

At block 928, the robotic actuator 116 receives an X-direction movement command 208 from a controller 104. The X-direction movement command 208 controls left and right movement by the robotic actuator 116. In one embodiment, the X-direction movement command 208 specifies a direction and a distance. In another embodiment, the X-direction movement command 208 specifies a home location for the robotic actuator 116. Flow proceeds to block 932.

At block 932, the robotic actuator 116 moves a distance that corresponds to the X-direction movement command 208. This horizontally positions the actuated magnet 124 at a home position, which is generally at the far left or far right of the X direction allowed travel. Flow ends at block 932.

Referring now to FIG. 9B, a flowchart illustrating a cover closing process using a sensor 950, in accordance with a fourth embodiment of the present invention is shown. The fourth embodiment uses repellant and attraction force similar to the third embodiment, but also includes the sensor 654 and software or firmware in the controller 104 to regulate magnetic force to regulate robotic actuator 116 travel velocity. Flow begins at block 954.

At block 954, the robotic actuator 116 receives a Y-direction movement command 308 from the controller 104. The Y-direction movement command 308 controls front and back movement by the robotic actuator 116. In one embodiment, the Y-direction movement command 308 specifies a direction and a distance. In another embodiment, the Y-direction movement command 308 specifies a distance only, and the type of command (Y-direction movement command 308) inherently specifies the direction. In yet another embodiment, the Y-direction movement command 308 is a "return to home position" command that instructs the robotic actuator 116 to return to a Y direction home position (i.e. near the front of the apparatus base 112 below the front most X direction travel rail 128). Flow proceeds to block 958.

At block 958, the robotic actuator 116 rotates 714 the rigid rotatable member 658 to configure the attraction force. The rigid rotatable member 658 couples the actuated magnet 124 to the robotic actuator 116, such that robotic actuator 116 movement is translated to the actuated magnet 124. In one embodiment, the rigid rotatable member 658 may be rotated 714 by the robotic actuator 116 in one or more directions. A robotic actuator command 108 may specify one or more of which direction to rotate (i.e. either clockwise or counterclockwise), to rotate 180 degrees, or to rotate a number of degrees specified within a robotic actuator command 108.

Rotating 714 the rigid rotatable member 658 modifies the attraction or repellant force between the actuated magnet 124 and the cover magnet 148. For example, assuming the magnetic polarities 504 between the magnets 124, 148 are opposing (and thus configured to repel), rotating the rigid rotatable member 658 180 degrees causes the magnetic polarities 504 to become coincidental (and thus configured to attract). Attraction force is maximized when the magnetic polarity 504 of the magnets 124, 148 facing each other are opposites and aligned on a common axis through the center of both magnets 124, 148. Repellant force is maximized when the magnetic polarity 504 of the magnets 124, 148 facing each other are the same and aligned on the common axis through the center of both magnets 124, 148.

Because the attraction force depends on angular displacement between the magnets 124, 148, configuring the attraction force may include rotating 714 the rigid rotatable member 658 a number of degrees to produce the desired attraction force. In some embodiments, this may be less than 180 degrees, between 90 and 180 degrees, or between 180 and 270 degrees. It may be desirable to configure the degree of attraction force in order to configure a movement speed of the cover 140 with respect to the embodiment illustrated and described in FIGS. 7A-7D. For example, depending on friction between the cover 140 and the cover travel rails 144, the smoothest "pulling" movement imparted to the cover 140 may result from a certain degree of rigid rotatable member 658 rotation. Flow proceeds to block 962.

At block 962, an actuated magnet 124 rigidly coupled to the robotic actuator 116 exerts an attraction force on the cover magnet 148. The amount of attraction force is a function of magnet strength of both magnets 124, 148, orientation between the magnets 124, 148, and a distance between the magnets 124, 148. In order to move the cover 140 without the magnets 124, 148 touching, the attraction force must be greater than friction force between the cover 140 and the cover travel rails 144 and the speed of the robotic actuator 116 and actuated magnet 124 must match the speed of the cover 140 and cover magnet 148. Flow proceeds to block 966.

At block 966, the robotic actuator 116 moves according to the Y-direction movement command 308. The Y-direction movement command 308 directs the robotic actuator 116 to move from over the cover 140 toward a home position near the front most X direction travel rail 128. Flow proceeds to block 970.

At block 970, the cover 140 moves forward due to the attraction force and the speed of robotic actuator 116 movement. As the cover 140 moves forward, the container for the chemical solution 408 is closed for access. Flow proceeds to decision block 974.

At decision block 974, a determination is made if the cover 140 travel is complete or the Y distance (i.e. the distance specified by the Y-direction movement command 308) has been reached. The cover 140 travel is complete when the cover 140 fully closes the container 152 for the chemical solution 408, as illustrated in FIG. 7D. The Y distance corresponds to a position of the robotic actuator 116 (and hence actuated magnet 124 and cover 140) that fully covers the chemical solution container 152. If either the cover 140 travel is complete or the Y distance has been reached, then flow proceeds to block 976. If the cover 140 travel is not complete and the Y distance has not been reached, then flow instead proceeds to block 978 to measure the gap between magnets 124, 148.

At block 976, the robotic actuator 116 continues until the Y distance has been reached, and a front edge of the cover 140 may rest against a stop 506, as previously discussed. There is no need to measure the gap between the actuated magnet 124 and the cover magnet 148 since the cover 140 is now closed and the actuated magnet 124 is moving away from the cover 140 and cover magnet 148. Flow proceeds to block 994.

At block 978, a sensor 654 measures a gap between the actuated magnet 124 and the cover magnet 148. In one embodiment, the sensor 654 may be an optical sensor. In another embodiment, the sensor 654 may be a magnetic sensor. In yet another embodiment, the sensor 654 may be a camera. Preferably, the gap is close to a separation distance D 512 since that provides an ideal degree of attraction force between the actuated magnet 124 and the cover magnet 148. The sensor 654 reports the measured gap to the controller 104, using a robotic actuator command and feedback 108. Flow proceeds to decision block 982.

At decision block 982, the controller 104 compares the measured gap to the separation distance 512. If the measured gap is more than the separation distance 512, then the robotic actuator 116 is leading the cover 140 by too much distance and flow proceeds to block 990. If the measured gap is less than the separation distance 512, then the robotic actuator 116 is leading the cover 140 by not enough distance and flow proceeds to block 986. If the measured gap is equal to the separation distance 512, then the robotic actuator 116 is leading the cover 140 by an ideal distance and flow proceeds to block 994.

At block 986, the robotic actuator 116 is leading the cover 140 by not enough distance and the controller 104 transmits a command 108 to the robotic actuator 116 to speed up. In response, the robotic actuator 116 speeds up in order to restore the separation distance 512. Flow proceeds to block 966.

At block 990, the robotic actuator 116 is leading the cover 140 by too much distance and the computer 104 transmits a command 108 to the robotic actuator 116 to slow down. Without this adjustment, the robotic actuator 116 may outrun the cover 140. This will reduce attraction force to a point that the cover 140 is no longer pulled forward and will stop prematurely—perhaps not covering the chemical solution 408. In response, the robotic actuator 116 slows down in order to restore the separation distance 512. Flow proceeds to block 966.

At block 994, the robotic actuator 116 receives an X-direction movement command 208 from the controller 104. The X-direction movement command 208 controls left and right movement by the robotic actuator 116. In one embodiment, the X-direction movement command 208 specifies a direction and a distance. In another embodiment, the X-direction movement command 208 specifies a home location for the robotic actuator 116. Flow proceeds to block 998.

At block 998, the robotic actuator 116 moves a distance that corresponds to the X-direction movement command 208. This horizontally positions the actuated magnet 124 at a home position, which is generally at the far left or far right of the X direction allowed travel. Flow ends at block 998.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. An apparatus, comprising:
   a container, comprising an open top and configured to hold a chemical solution;
   a first magnet assembly, comprising:
      a first magnet, comprising a first polarity; and
      a cover of planar disposition comprising top and bottom sides, the top side coupled to a side surface of the first magnet, the bottom side configured to move across a top surface of the container between an open and a closed position and limit evaporation of the solution when in the closed position, the first magnet comprising a first magnetic axis through a north pole and a south pole of the first magnet, the first magnetic axis parallel to the plane of the cover;
   a controller; and
   a second magnet assembly, comprising a second magnet, the second magnet comprising a north pole and a south pole and further comprising a second polarity, configured to receive a command from the controller to move the cover to one of the open position and the closed position and in response move the second magnet assembly relative to the first magnet assembly-without direct contact to the first magnet assembly.

2. The apparatus of claim 1, wherein the first and second polarity comprises the north pole of the first and second magnets face a common direction, wherein the second magnet assembly moves the cover to the open position by an attraction force between the first and second magnets in response to a separation distance between the first and second magnets.

3. The apparatus of claim 1, wherein the first and second polarity comprises the north pole of the first and second magnets face opposite directions, wherein the second magnet assembly moves the cover to the open position by a repellant force between the first and second magnets in response to a separation distance between the first and second magnets.

4. The apparatus of claim 1, wherein the cover is slidingly engaged to one or more travel rails configured to provide a movement path for the cover between the open and closed positions.

5. The apparatus of claim 1, further comprising:
one or more springs, coupled to the cover, configured to provide a force to return the cover to the closed position in response to the second magnet assembly moves away from the first magnet assembly.

6. The apparatus of claim 1, wherein the second magnet assembly further comprises:
an actuator, configured to move in a plurality of directions in response to received commands from the controller; and
a rigid lengthwise member, comprising a first end and a second end opposite the first end, wherein the first end is coupled to the actuator and the second end is coupled to the second magnet, configured to translate actuator movement into second magnet movement.

7. The apparatus of claim 1, wherein the second magnet assembly further comprises:
a sensor, configured to report a separation distance between the first and second magnets to the controller, wherein the controller generates one or more commands to the second magnet assembly in response to the separation distance is different than a predetermined separation distance, wherein the predetermined separation distance corresponds to a desired level of attraction or repellant force between the first and second magnets.

8. The apparatus of claim 1, wherein the second magnet assembly is configured to rotate the second magnet to change the second polarity to be opposite the first polarity, wherein in response to the second polarity opposite to the first polarity and the first and second magnets separated by a separation distance, the second magnet assembly is configured to move the cover from the open position to the closed position without direct contact to the first magnet assembly, in response to a command from the controller.

9. A system, comprising:
a controller;
an open-top container configured to hold a chemical solution;
a cover of planar disposition and comprising top and bottom sides, the bottom side configured to slide over the top of the container between open and closed positions, the cover configured to limit evaporation of a chemical solution when in the closed position;
a first magnet, affixed to a top side of the cover;
a second magnet, configured to one of provide an attraction force to the first magnet in response to a predetermined separation distance and opposite polarities between the first and second magnets and provide a repellant force to the first magnet in response to the predetermined separation distance and same polarities between the first and second magnets;
an actuator, coupled to the second magnet and the controller, configured to receive one or more movement commands from the controller to move the second magnet relative to the first magnet.

10. The system of claim 9, further comprising:
one or more springs, coupled to the cover, configured to provide a force to return the cover to the closed position in response to more than the predetermined separation distance between the first and second magnets.

11. The system of claim 9, wherein the controller is configured to issue one or more commands to the actuator to move the cover from the closed position to the open position, and in response the actuator is configured to move the second magnet the predetermined separation distance from the first magnet, and move the second magnet toward the first magnet a distance for the cover to be in the open position.

12. The system of claim 9, wherein the controller is configured to issue one or more commands to the actuator to move the cover from the open position to the closed position, and in response the actuator is configured to move the second magnet the predetermined separation distance from the first magnet while the second magnet provides the attraction force to the first magnet, and move the second magnet away from the first magnet a distance for the cover to be in the closed position.

13. The system of claim 9, further comprising:
a rigid rotatable member, lengthwise disposed between the actuator and the second magnet, configured to translate a rotation force by the actuator to the second magnet in order to change a second magnet polarity with respect to the first magnet, wherein the second magnet comprises a magnetic axis through a north and a south pole of the second magnet that is perpendicular to the lengthwise disposition of the rigid rotatable member.

14. The system of claim 9, wherein the system further comprises:
a sensor, coupled to the controller, configured to report a separation distance between the first and second magnets to the controller, wherein the controller is configured to generate one or commands to the actuator in response to the separation distance different from the predetermined separation distance, wherein the predetermined separation distance corresponds to a desired level of attraction or repellant force between the first and second magnets.

15. A method, comprising:
receiving, by an actuator coupled to a second magnet and a controller, one or more movement commands from the controller to move the second magnet relative to a first magnet affixed to a top side of a cover configured to slide over a container between closed and open positions, the container comprising an open top and configured to hold a chemical solution, the cover of planar disposition and configured to limit evaporation of the chemical solution when in the closed position; and
moving, by the actuator, the second magnet a predetermined separation distance from the first magnet, the second magnet providing a repellant force to the first magnet in response to the predetermined separation distance and same polarities between the first and second magnets and providing an attraction force to the first magnet in response to a predetermined separation distance and opposite polarities between the first and second magnets.

16. The method of claim 15, comprising:
issuing, by the controller, one or more commands to the actuator to move the cover from the closed position to the open position, and in response:
moving, by the actuator, the second magnet the predetermined separation distance from the first magnet; and
moving, by the actuator, the second magnet toward the first magnet a distance for the cover to be in the open position.

17. The method of claim 15, comprising:
issuing, by the controller, one or more commands to the actuator to move the cover from the open position to the closed position, and in response:
- moving, by the actuator, the second magnet the predetermined separation distance from the first magnet while the second magnet provides the attraction force to the first magnet; and
- moving, by the actuator, the second magnet away from the first magnet a distance for the cover to be in the closed position.

18. The method of claim 15, comprising:
translating a rotation force between the actuator and the second magnet, by a rigid rotatable member lengthwise disposed between the actuator and the second magnet, in order to change a second magnet polarity with respect to the first magnet.

19. The method of claim 18, wherein the second magnet comprises a magnetic axis through a north and a south pole of the second magnet that is perpendicular to the lengthwise disposition of the rigid rotatable member.

20. The method of claim 15, comprising:
- reporting, by a sensor coupled to the controller, a separation distance between the first and second magnets to the controller; and
- generating, by the controller, one or more commands to the actuator in response to the separation distance being different from the predetermined separation distance,
- wherein the predetermined separation distance corresponding to a desired level of attraction or repellant force between the first and second magnets.

* * * * *